United States Patent
Bower et al.

(10) Patent No.: US 10,230,048 B2
(45) Date of Patent: Mar. 12, 2019

(54) OLEDS FOR MICRO TRANSFER PRINTING

(71) Applicant: X-Celeprint Limited, Cork (IE)

(72) Inventors: Christopher Bower, Raleigh, NC (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 14/869,369

(22) Filed: Sep. 29, 2015

(65) Prior Publication Data

US 2017/0092863 A1  Mar. 30, 2017

(51) Int. Cl.
| | |
|---|---|
| *H01L 51/00* | (2006.01) |
| *H01L 51/52* | (2006.01) |
| *H01L 51/56* | (2006.01) |
| *H01L 27/32* | (2006.01) |

(52) U.S. Cl.
CPC ...... *H01L 51/0013* (2013.01); *H01L 27/3206* (2013.01); *H01L 27/3225* (2013.01); *H01L 51/0023* (2013.01); *H01L 51/5206* (2013.01); *H01L 51/5221* (2013.01); *H01L 51/5253* (2013.01); *H01L 51/56* (2013.01); *H01L 2227/323* (2013.01)

(58) Field of Classification Search
CPC ......... H01L 51/56; H01L 51/00; H01L 27/32; H01L 51/52
USPC ................... 257/773, 774; 345/211; 438/612
See application file for complete search history.

(56) References Cited

U.S. PATENT DOCUMENTS

| | | | |
|---|---|---|---|
| 4,746,202 | A | 5/1988 | Perilloux et al. |
| 5,060,027 | A | 10/1991 | Hart et al. |
| 5,550,066 | A | 8/1996 | Tang et al. |
| 5,621,555 | A | 4/1997 | Park |
| 5,625,202 | A | 4/1997 | Chai |
| 5,748,161 | A | 5/1998 | Lebby et al. |
| 5,815,303 | A | 9/1998 | Berlin |
| 5,994,722 | A | 11/1999 | Averbeck et al. |
| 6,025,730 | A | 2/2000 | Akram et al. |

(Continued)

FOREIGN PATENT DOCUMENTS

| | | |
|---|---|---|
| CN | 103677427 A | 3/2014 |
| EP | 1662301 A1 | 5/2006 |

(Continued)

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

(Continued)

*Primary Examiner* — Sheng-Bai Zhu
(74) *Attorney, Agent, or Firm* — William R. Haulbrook; Michael D. Schmitt; Choate, Hall & Stewart LLP

(57) ABSTRACT

An organic light-emitting diode (OLED) structure includes an organic light-emitting diode having a first electrode, one or more layers of organic material disposed on at least a portion of the first electrode, and a second electrode disposed on at least a portion of the one or more layers of organic material. At least a portion of a tether extending from a periphery of the organic light-emitting diode. The organic light-emitting diodes can be printable organic light-emitting diode structures that are micro transfer printed over a display substrate to form a display.

15 Claims, 25 Drawing Sheets

(56) References Cited

U.S. PATENT DOCUMENTS

| | | |
|---|---|---|
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,552,740 B1 | 4/2003 | Wong et al. |
| 6,574,032 B1 | 6/2003 | Roddy et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,179,401 B2 | 5/2012 | Ishii |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,860,955 B2 | 1/2018 | Kim et al. |
| 9,871,345 B2 | 1/2018 | Bower et al. |
| 9,980,341 B2 | 5/2018 | Bower et al. |
| 2001/0022564 A1 | 9/2001 | Youngquist et al. |
| 2002/0096994 A1 | 7/2002 | Iwafuchi et al. |
| 2003/0001165 A1 | 1/2003 | Taki |
| 2004/0080483 A1 | 4/2004 | Chosa |
| 2004/0135160 A1 | 7/2004 | Cok |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |

(56) References Cited

U.S. PATENT DOCUMENTS

| | | |
|---|---|---|
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0246811 A1* | 11/2006 | Winters ............. H01L 51/5253 |
| | | 445/25 |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1* | 8/2007 | Yarid ..................... B41J 2/45 |
| | | 347/238 |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0140630 A1 | 6/2009 | Kijima et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0316008 A1 | 12/2011 | Yokogawa |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1* | 8/2012 | Cok .................... H01L 27/3255 |
| | | 345/211 |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0326175 A1 | 12/2012 | Hu et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1* | 5/2013 | Bibl ..................... H01L 33/04 |
| | | 362/259 |
| 2013/0153934 A1 | 6/2013 | Meitl et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1* | 1/2014 | Higginson ......... H01L 23/3171 |
| | | 257/13 |
| 2014/0082934 A1 | 3/2014 | Cok |
| 2014/0084482 A1* | 3/2014 | Hu ........................ H01L 24/06 |
| | | 257/774 |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0151715 A1 | 6/2014 | Smirnov et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1* | 11/2014 | Bathurst ................... F21K 9/00 |
| | | 362/249.02 |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |

(56) References Cited

U.S. PATENT DOCUMENTS

| | | |
|---|---|---|
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |

OTHER PUBLICATIONS

Yaniv et al., A 640×480 Pixel Computer Display Using Pin Diodes with Device Redundancy, 1988 International Display Research Conference, IEEE, CH-2678-1/88:152-154 (1988).

U.S. Appl. No. 14/788,632, filed Jun. 30, 2015, X-Celeprint Limted.

U.S. Appl. No. 14/807,311, filed Jul. 23, 2015, X-Celeprint Limited.

U.S. Appl. No. 14/822,866, filed Aug. 10, 2015, Bower et al.

Choi, H. W. et al., Efficient GaN-based Micro-LED Arrays, Mat. Res. Soc. Symp. Proc. 743:L6.28.1-L6.28.6 (2003).

Cok, R. S. et al., AMOLED displays with transfer-printed integrated circuits, Journal of SID 19/(4):335-341(2011).

Hamer et al., "63.2: AMOLED Displays Using Transfer-Printed Integrated Circuits," SID 09 DIGEST, 40(2):947-950 (2009).

Johnson, K. et al., Advances in Red VCSEL Technology, Advances in Optical Technologies, 2012:569379, 13 pages (2012).

Kasahara, D. et al, Nichia reports first room-temperature blue/ 'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Poher, V. et al., Micro-LED arrays: a tool for two-dimensional neuron stimulation, J. Phys. D: Appl. Phys. 41:094014 (2008).

Seurin, J.F. et al, High-power red VCSEL arrays, Proc. of SPIE 8639:1-9 (2013).

Yoon, J. et al., Heterogeneously Integrated Optoelectronic Devices Enabled by MicroTransfer Printing, Adv. Optical Mater. 3:1313-1335 (2015).

Matioli, E. et al., High-brightness polarized light-emitting diodes, Light: Science & Applications, 1:e22:1-7 (2012).

Yu, Jennifer and Bulovic, Vladimir, Micropatterning metal electrode of organic light emitting devices using rapid polydimethylsiloxane lift-off, Applied Physics Letters, 91:043102-1-043102-3, (2007).

* cited by examiner

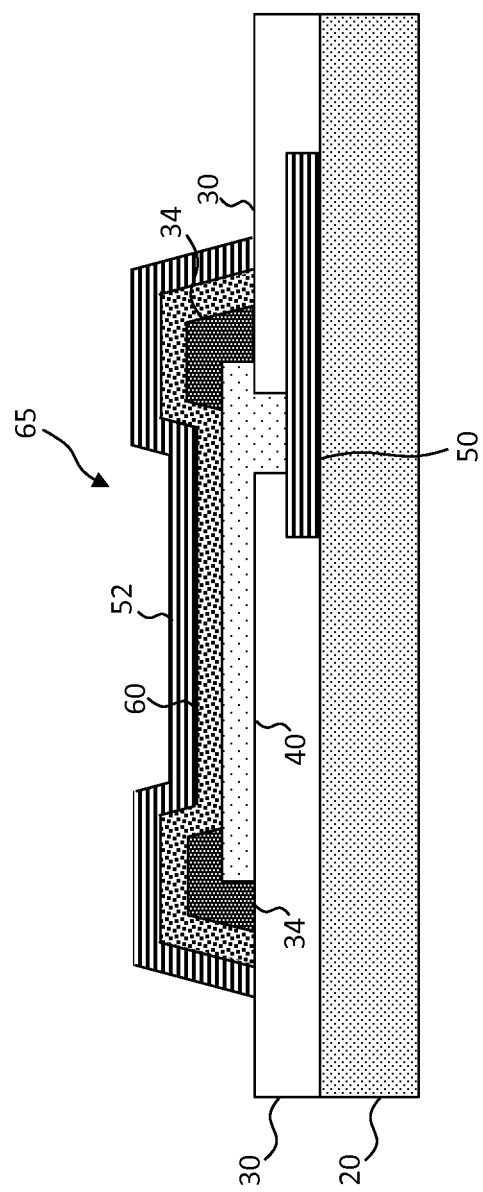

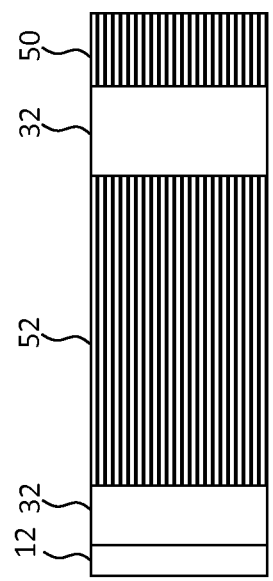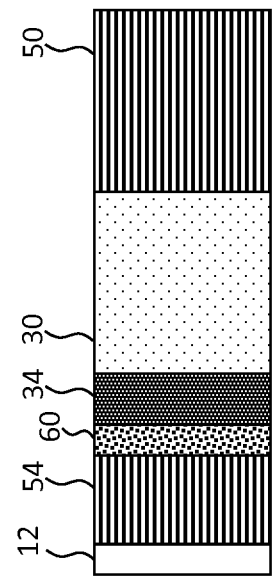

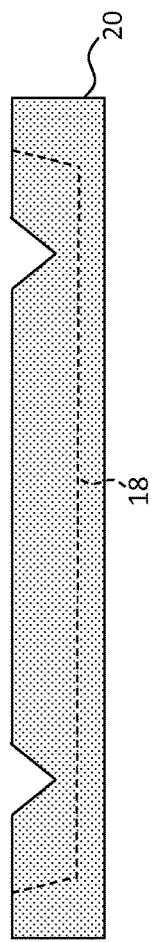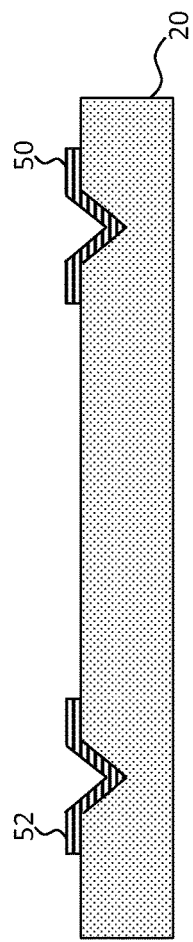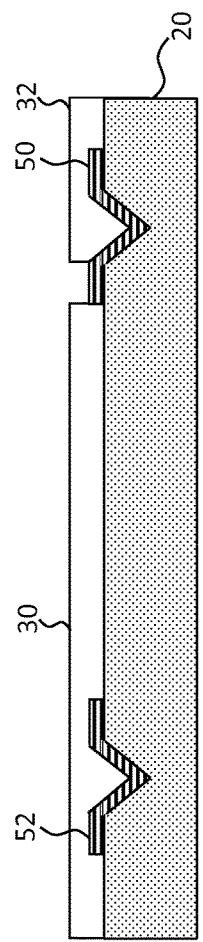

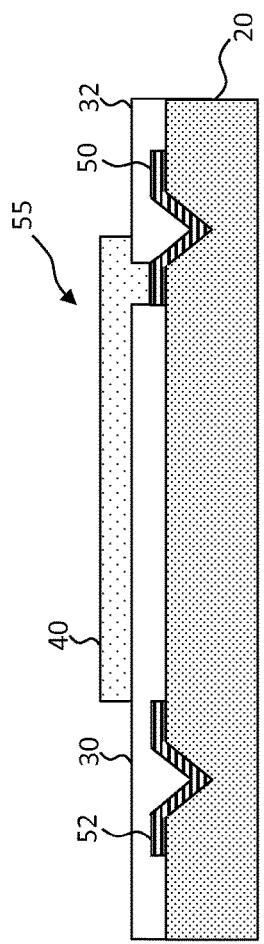
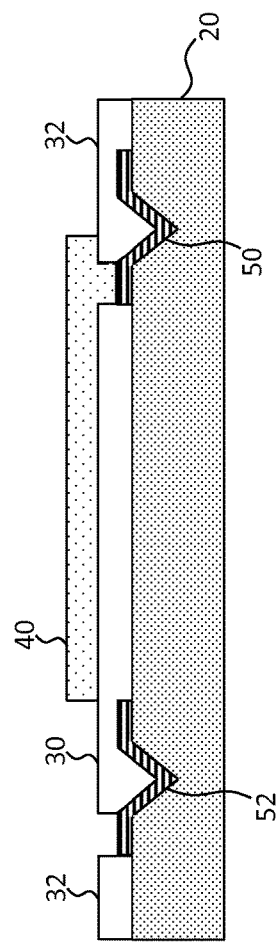
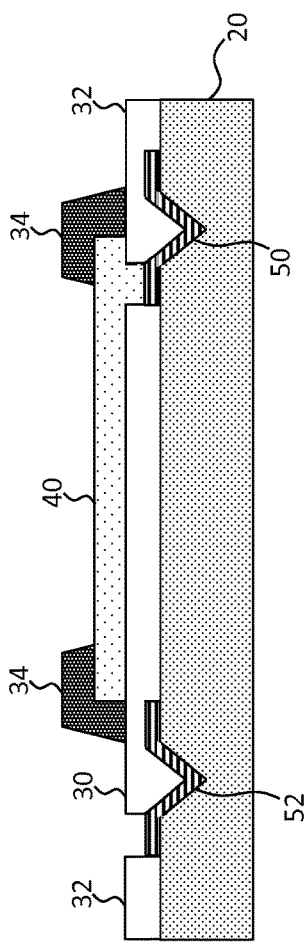

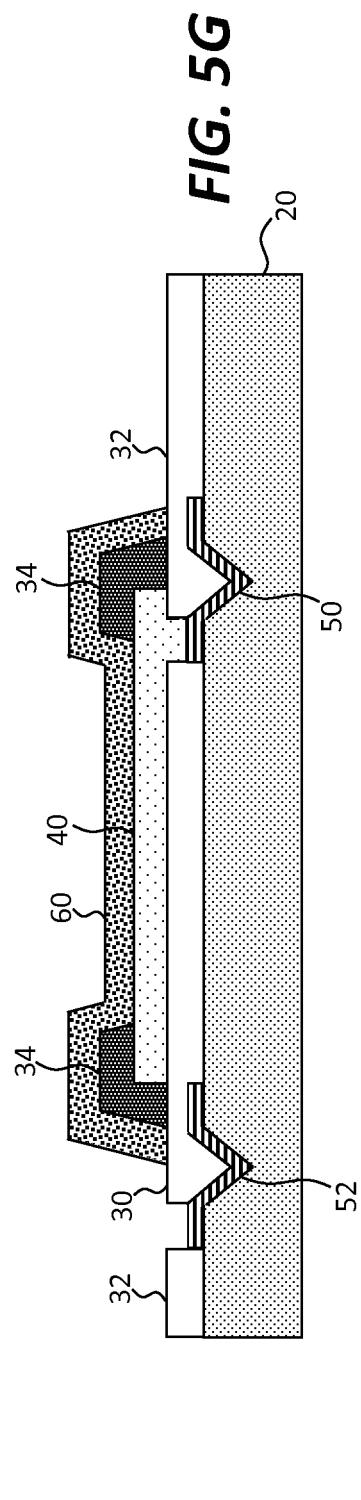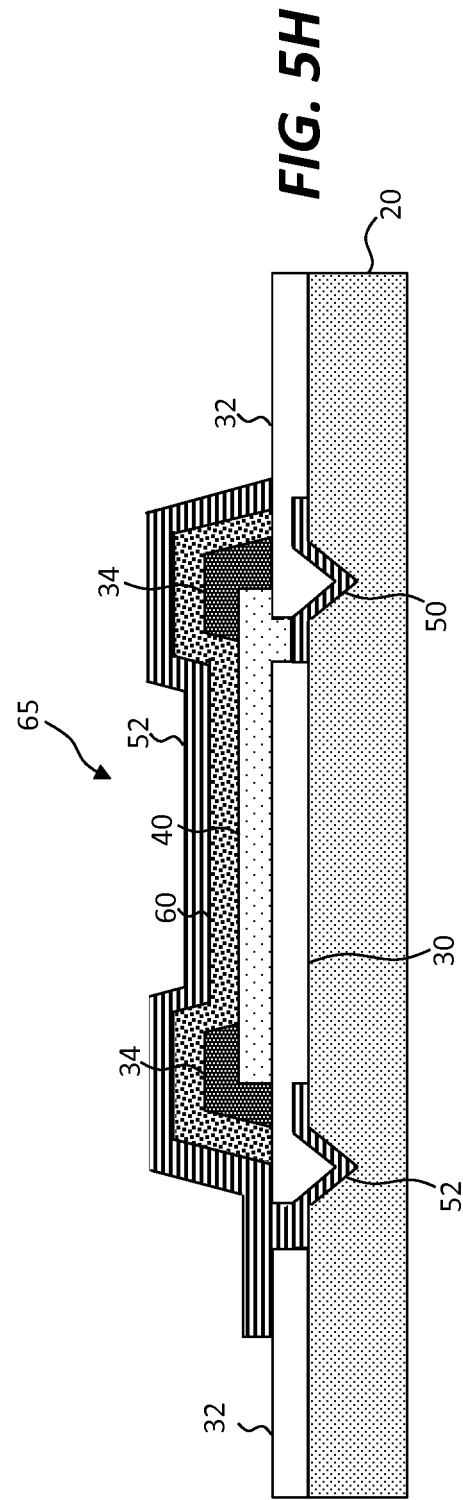

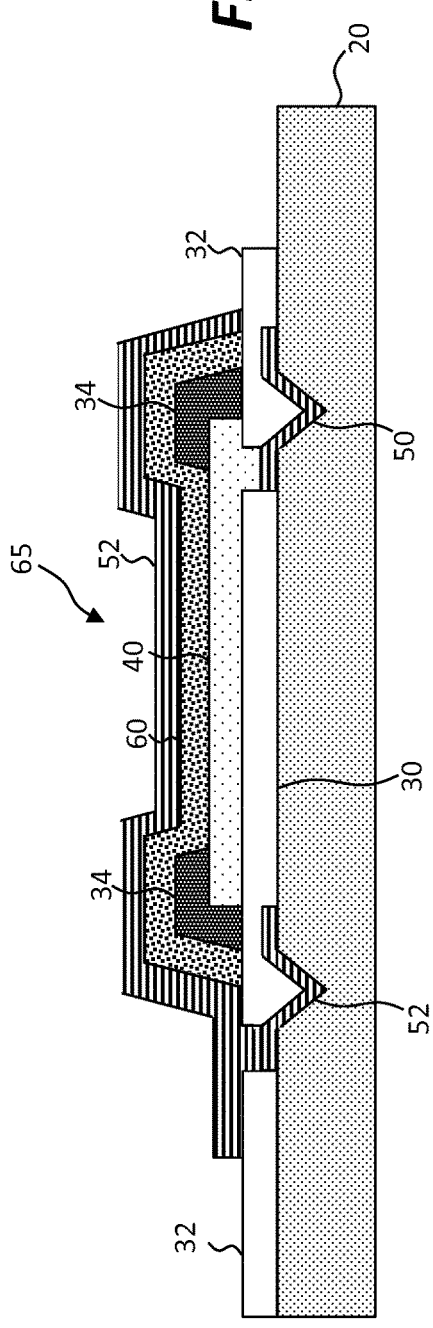
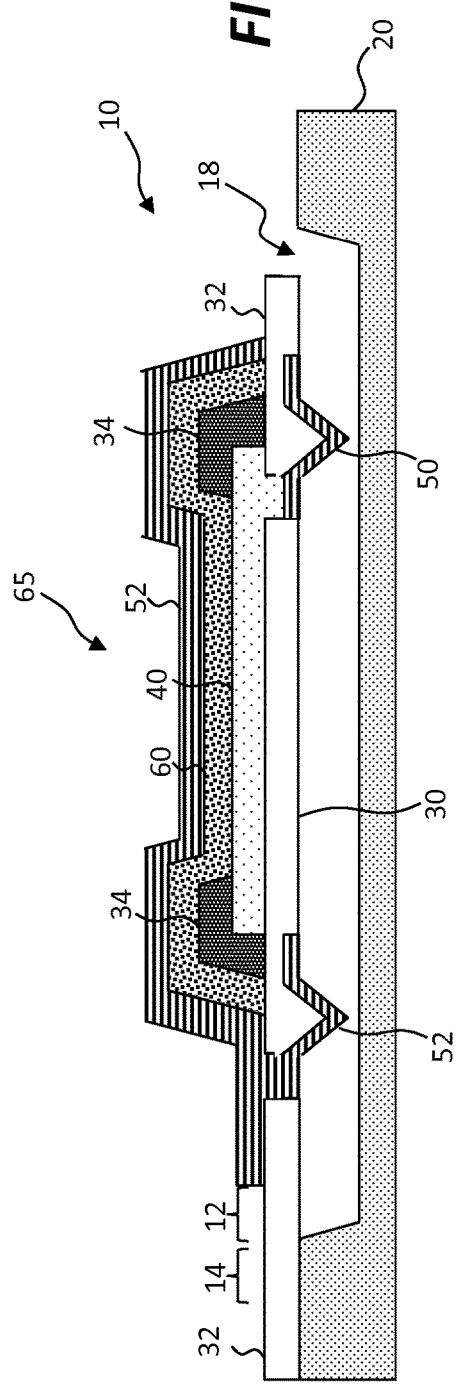

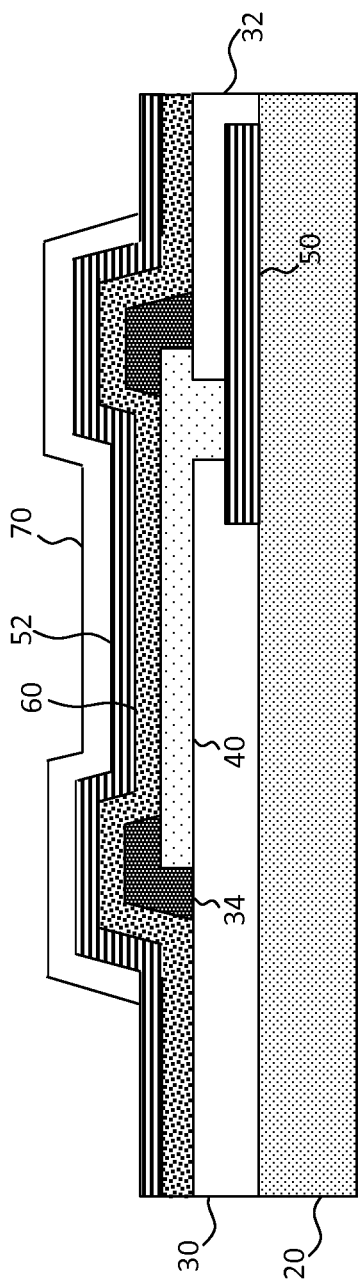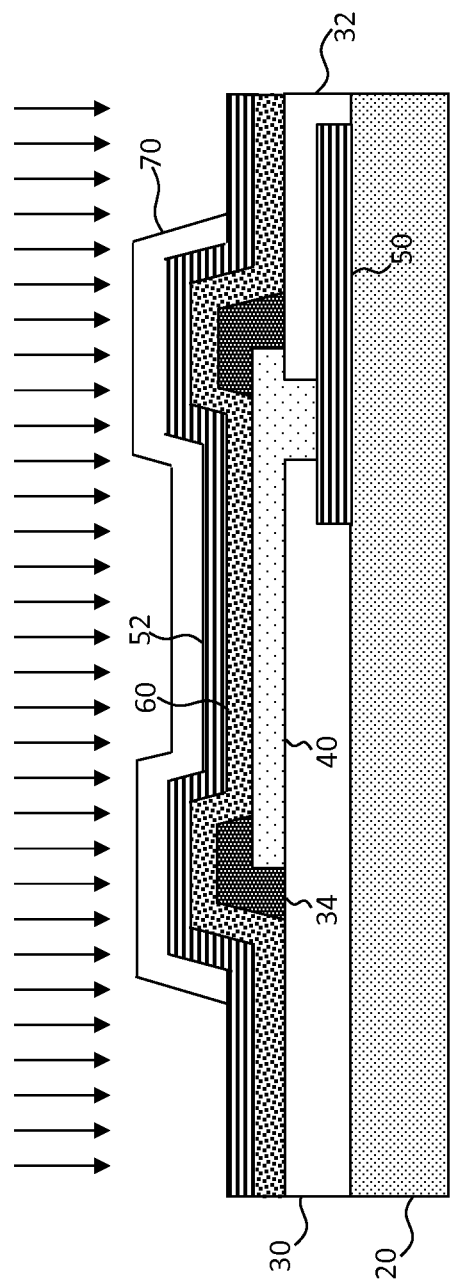
FIG. 7C
FIG. 7D

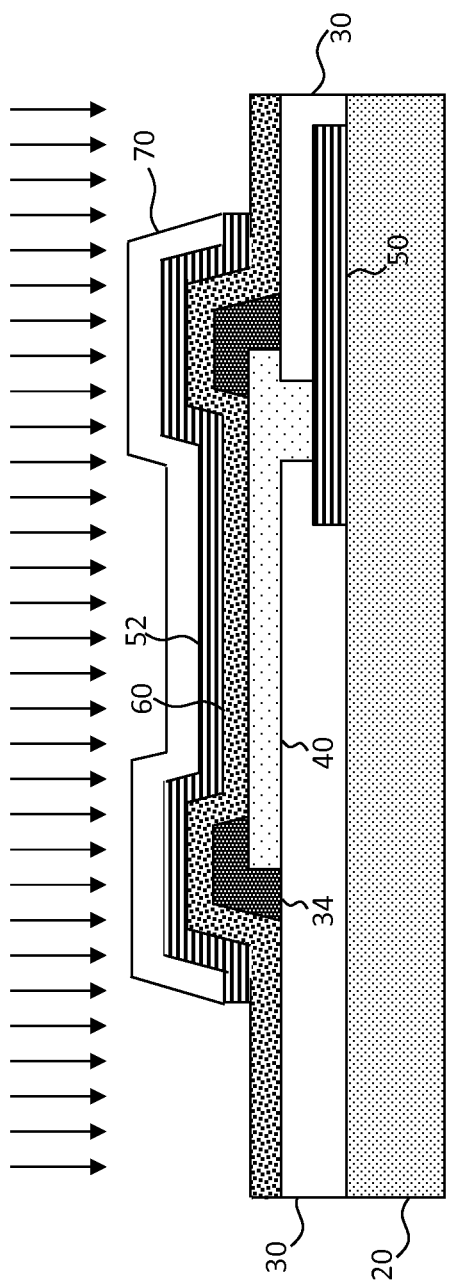
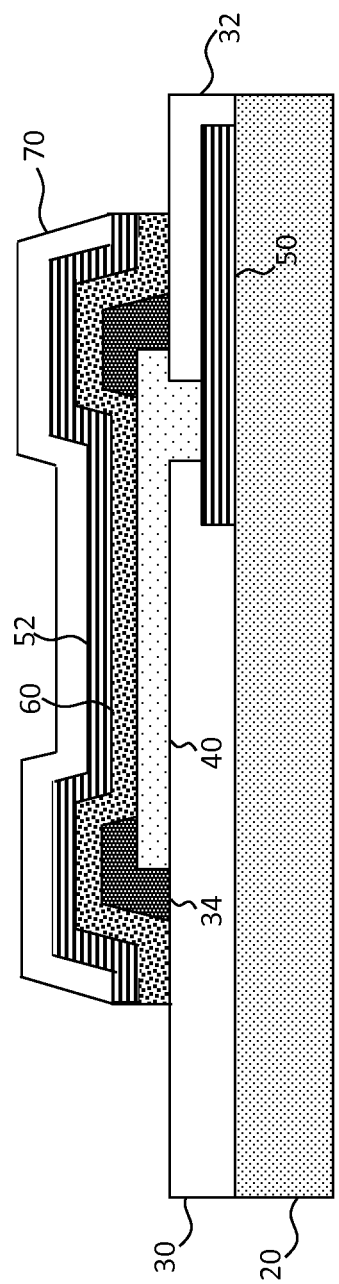

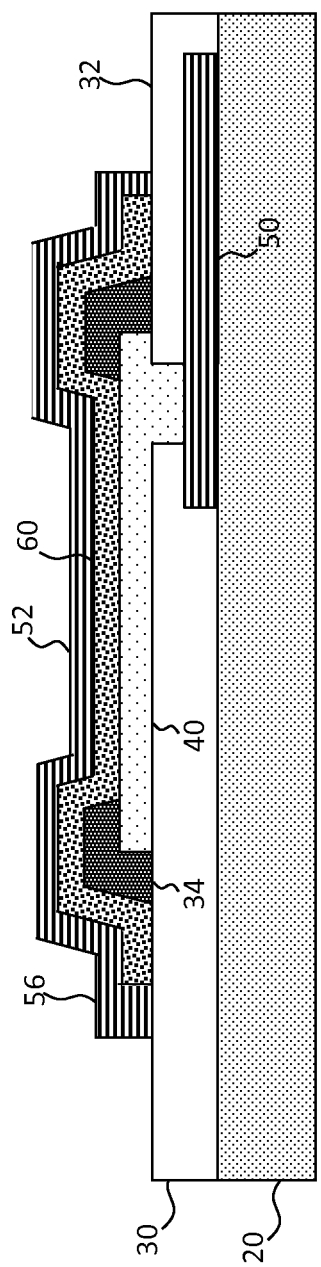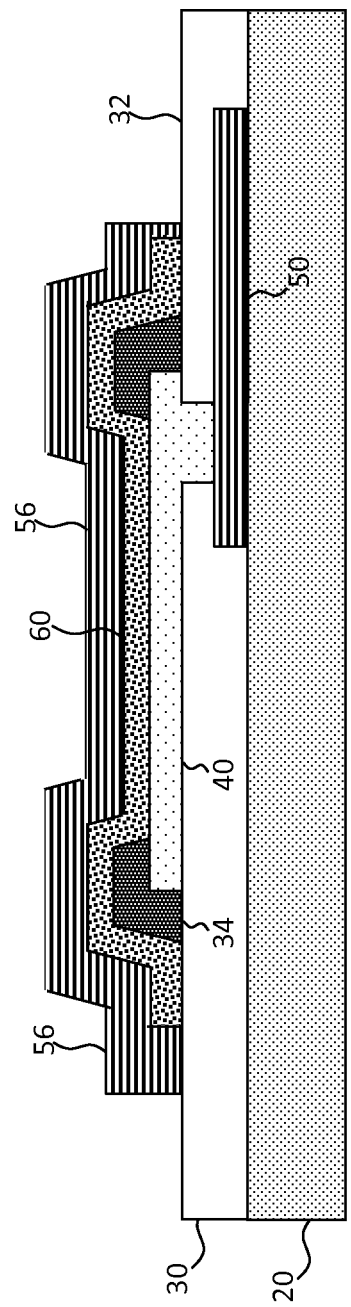

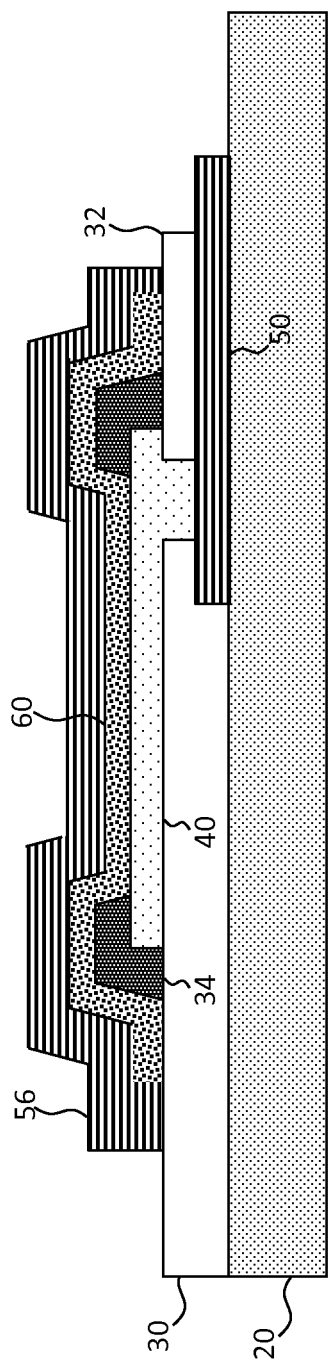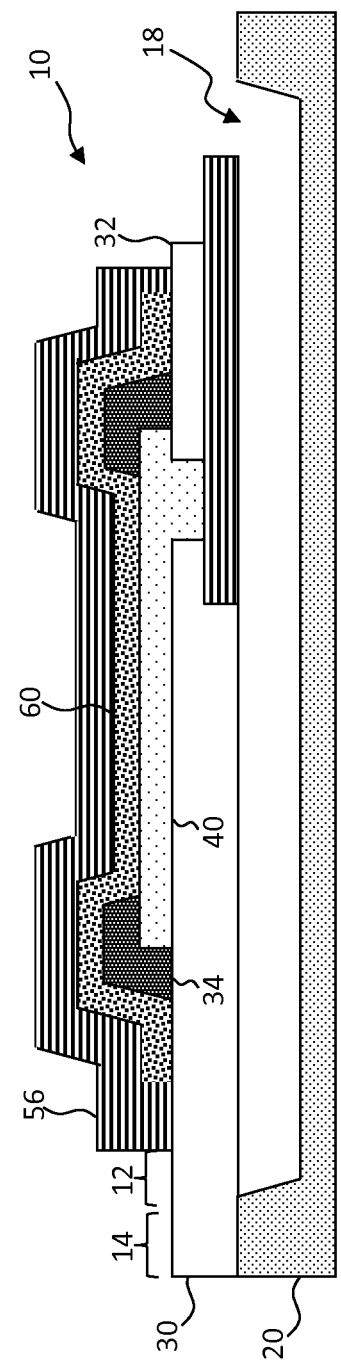

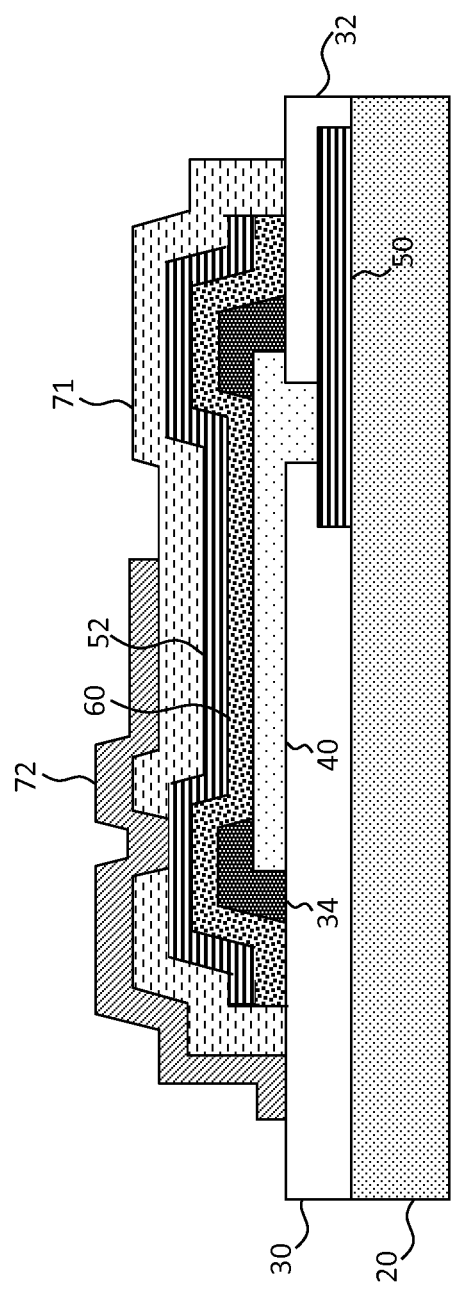
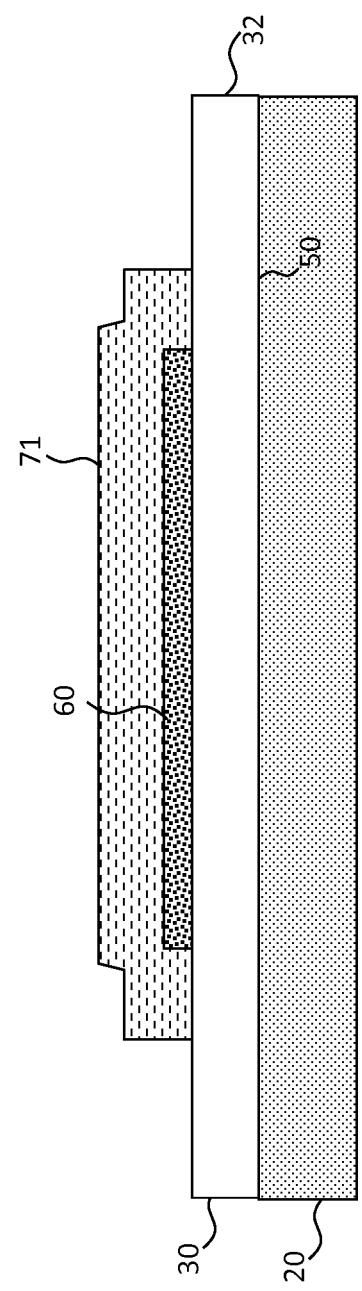
FIG. 7M
FIG. 7N

# OLEDS FOR MICRO TRANSFER PRINTING

FIELD OF THE INVENTION

The present invention relates to organic light-emitting diode (OLED) displays and to micro transfer printing.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television.

The various light-emitting technologies have different characteristics, advantages, and disadvantages. For example, liquid crystals are simple to control and have a highly developed and sophisticated technological infrastructure. Organic LEDs are area emitters, can be more efficient and flexible, and are demonstrated in a very thin form factor. Inorganic light-emitting diodes are very efficient and provide relatively saturated light in an environmentally robust structure. Lasers are also efficient, provide a virtually monochromatic light, but have a limited viewing angle. None of these technologies, however, meet all of a display viewer's needs under all circumstances.

Organic light-emitting diodes are widely used in portable electronic devices with displays and in some televisions. Organic LEDs are area emitters, can be efficient and flexible, can have a very thin form factor, and have an excellent viewing angle. However, the process used to manufacture OLED displays has some challenging steps. An OLED emitter typically includes several layers, for example a hole-injection layer, a light-emitting layer, and an electron-injection layer. The hole-injection layer is coated on a first electrode such as an anode and a second electrode such as a cathode is formed on an electron-injection layer. Alternatively, an electron-injection layer is formed on a cathode and the anode is formed on a hole-injection layer.

One type of OLED display is made with a common unpatterned light emitter for all pixels and patterned color filters that filter the light from each light-emitter in the display. Different color filters produce different colors and the common light emitter emits white light, for example a combination of blue and yellow light. This display type is similar to the color-filter approach found in LCDs and suffers from the loss of approximately two thirds of the emitted light in the color filters.

Another type of OLED display uses different organic material patterned over a display substrate. The different OLED materials are chosen to emit different colors of light and are patterned to form pixels, typically arranged in stripes. The strip pattern is formed by depositing organic material through a fine metal shadow mask. A different mask is used for each different set of materials, or at least for the different light-emitting layers. The alignment of the masks before deposition is difficult, and the repeated use of the masks can damage deposited materials. Moreover, the masks must be periodically cleaned, are easily damaged, difficult to make, and expensive.

There is a need, therefore, for devices, systems and methods for providing OLED light emitters that have improved efficiency, reduced costs, and fewer mechanical process steps.

SUMMARY OF THE INVENTION

The present invention provides structures, devices and methods for organic light-emitting diodes and color displays that require fewer or no shadow masks for evaporative deposition of organic materials. The organic light-emitting diode structures can be micro transfer printed and organic light-emitting diode structures that each emit different colors of light can be separately constructed on separate source substrates, released from the source substrate, and micro transfer printed to a destination display substrate. The organic light-emitting diode structures and methods mitigate the problems encountered with repeated use of fine metal shadow masks, such as alignment to a common display substrate and damage to organic materials deposited on the display substrate.

Moreover, in an embodiment, the use of fine metal shadow masks is unnecessary for patterning evaporated organic materials. Higher resolution OLED displays are thereby enabled.

In one aspect, the disclosed technology includes a structure including an organic light-emitting diode (OLED) having a first electrode, one or more layers of organic material disposed on at least a portion of the first electrode, and a second electrode disposed on at least a portion of the one or more layers of organic material; and at least a portion of a tether extending from a periphery of the organic light-emitting diode.

In certain embodiments, at least a portion of the first electrode is transparent.

In certain embodiments, at least a portion of the second electrode is transparent.

In certain embodiments, the layers of organic material comprise one or more of a hole-injection layer, a light-emitting layer, and an electron-injection layer.

In certain embodiments, the OLED has a light-emitting area that has a dimension parallel to the first electrode that is less than or equal to 40 microns, less than or equal to 20 microns, less than or equal to 10 microns, or less than or equal to 5 microns.

In certain embodiments, the OLED has a light-emitting area that is less than or equal to 1600 square microns, less than or equal to 800 square microns, less than or equal to 400 square microns, less than or equal to 200 square microns, less than or equal to 100 square microns, or less than or equal to 50 square microns.

In certain embodiments, the first electrode comprises a transparent electrode in electrical contact with an opaque first electrode portion, and a transparent insulator, wherein the transparent insulator is at least partly in a common layer with the opaque first electrode portion.

In certain embodiments, the transparent electrode is disposed on a transparent insulator.

In certain embodiments, the first electrode comprises a first protrusion and the second electrode comprises a second protrusion separate from the first protrusion, the first and second protrusions extending in a direction from the second electrode to the first electrode.

In certain embodiments, the first electrode is a unitary electrical conductor.

In certain embodiments, the organic light-emitting diode is a top emitter.

In certain embodiments, the organic light-emitting diode is a bottom emitter.

In certain embodiments, the organic-light emitting diode a light-emissive area of less than 1600 square microns, less than or equal to 800 square microns, less than or equal to 400 square microns, less than or equal to 200 square microns, less than or equal to 100 square microns, or less than or equal to 50 square microns.

In certain embodiments, the organic-light emitting diode has at least one of a width from 5 to 10 μm, 10 to 20 μm, or 20 to 50 μm, a length from 5 to 10 μm, 10 to 20 μm, or 20 to 50 μm, and a height from 2 to 5 μm, 4 to 10 μm, 10 to 20 μm, or 20 to 50 μm.

In certain embodiments, the structure includes a source substrate having a portion defining an anchor; and a sacrificial layer formed on the source substrate and adjacent to the anchor, wherein the OLED is disposed on the sacrificial layer and the tether is connected to the anchor.

In certain embodiments, an oxide layer or a pre-determined designated portion of the source substrate.

In certain embodiments, the sacrificial layer comprises a cavity between the organic light-emitting diode and the source substrate.

In certain embodiments, the structure includes a plurality of OLED structures formed on the source substrate, wherein the one or more layers of organic material in each of the OLED structures is the same.

In certain embodiments, at least one of the one or more layers of organic material emits red light, green light, or blue light.

In certain embodiments, the structure includes first and second OLED structures formed on the source substrate and wherein the first OLED structure comprises at least one layer of organic material that emits a first color of light and the second OLED structure comprises at least one layer of organic material that emits a second color of light different from the first color of light.

In certain embodiments, the structure includes a third OLED structure formed on the source substrate, wherein the third OLED structure comprises at least one layer of organic material that emits a third color of light different from the first color of light and different from the second color of light.

In certain embodiments, the first color of light is red, the second color of light is green, and the third color of light is blue.

In certain embodiments, the portion of a tether extending from the periphery of the organic light-emitting diode is a portion of a broken tether.

In certain embodiments, the structure includes a first conductive protrusion extending from the structure and electrically connected to the first electrode; and a second conductive protrusion extending from the structure and electrically connected to the second electrode.

In another aspect, the disclosed technology includes a display having printable organic light-emitting diode structures, including: a display substrate; one or more organic light-emitting diode structures described above and herein disposed on the display substrate; a first electrical conductor electrically connected to the first electrode; and a second electrical conductor electrically connected to the second electrode.

In certain embodiments, at least one of the first electrical conductor and the second electrical conductor is located on the display substrate.

In certain embodiments, one or more of the OLED structures are grouped into pixels and the display comprises a pixel controller located on the display substrate electrically connected to the first and second electrodes of the pixels in the group to control the light output from the OLED structures.

In certain embodiments, the display includes one or more inorganic light-emitting diodes, wherein the one or more OLED structures comprises a first OLED structure that emits light of a first color and a second inorganic light-emitting diode that emits light of a second color different from the first color.

In certain embodiments, the one or more OLED structures comprises at least a first OLED structure that emits light of a first color and a second OLED structure that emits light of a second color different from the first color.

In certain embodiments, two or more of the OLED structures are grouped into pixels, each pixel including: a first OLED structure that emits light of the first color; a second OLED structure that emits light of the second color; and a pixel substrate, separate and distinct from the display substrate and the source substrate, on which the first and second OLED structures are disposed, wherein the pixel substrate is disposed on the display substrate.

In certain embodiments, the display includes a pixel controller located on the pixel substrate electrically connected to the first and second electrodes of each of the first and second OLED structures in the pixel to control the light output from the first and second OLED structures.

In certain embodiments, the organic light-emitting diode is a top emitter.

In certain embodiments, the organic light-emitting diode is a bottom emitter.

In certain embodiments, the organic-light emitting diode a light-emissive area of less than 1600 square microns, less than or equal to 800 square microns, less than or equal to 400 square microns, less than or equal to 200 square microns, less than or equal to 100 square microns, or less than or equal to 50 square microns.

In certain embodiments, the organic-light emitting diode has at least one of a width from 5 to 10 μm, 10 to 20 μm, or 20 to 50 μm, a length from 5 to 10 μm, 10 to 20 μm, or 20 to 50 μm, and a height from 2 to 5 μm, 4 to 10 μm, 10 to 20 μm, or 20 to 50 μm.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the display substrate comprises a polymer, plastic, resin, polyimide, PEN, PET, metal, metal foil, glass, a semiconductor, or sapphire.

In certain embodiments, the display substrate has a transparency greater than or equal to 50%, 80%, 90%, or 95% for visible light.

In certain embodiments, the organic light-emitting diode, when energized, emits light in a direction opposite the display substrate.

In certain embodiments, the organic light-emitting diode, when energized, emits light through the display substrate.

In another aspect, the disclosed technology includes a method of making an OLED structure, including: providing a source substrate; patterning a sacrificial layer on the source substrate; patterning a first electrode on the sacrificial layer;

patterning one or more layers of organic material on at least a portion of the patterned first electrode; and patterning a second electrode on at least a portion of the one or more layers of organic material to form an OLED structure.

In certain embodiments, the method includes removing at least a portion of the sacrificial layer, thereby partially releasing the OLED structure from the source substrate.

In certain embodiments, the method includes micro transfer printing the OLED structure from the source substrate to a display substrate.

In certain embodiments, the one or more layers of organic material are one or more layers of organic material that emit blue light and the OLED structure is a blue OLED structure that emits blue light when a current is applied thereto.

In certain embodiments, the method includes forming a red OLED structure that emits red light when a current is applied thereto, including: providing a second source substrate; patterning a second sacrificial layer on or in the second source substrate; patterning a first electrode on the second sacrificial layer; patterning one or more layers of organic material that emit red light on at least a portion of the patterned first electrode on the second sacrificial layer; and patterning a second electrode on at least a portion of the one or more layers of organic material that emit red light; and forming a green OLED structure that emits green light when a current is applied thereto, including: providing a third source substrate; patterning a third sacrificial layer on or in the third source substrate; patterning a first electrode on the third sacrificial layer; patterning one or more layers of organic material that emit green light on at least a portion of the patterned first electrode on the third sacrificial layer; and patterning a second electrode on at least a portion of the one or more layers of organic material that emit green light.

In certain embodiments, the method includes micro transfer printing the red OLED structure from the red source substrate to a display substrate; micro transfer printing the green OLED structure from the green source substrate to the display substrate; and micro transfer printing the blue OLED structure from the blue source substrate to the display substrate.

In certain embodiments, the at least ten thousand, one-hundred thousand, one million, or ten million OLEDs are on each source substrate.

In certain embodiments, patterning the one or more layers of organic material on the patterned first electrode comprises depositing the layers of organic material through a fine metal shadow mask.

In certain embodiments, patterning the one or more layers of organic material on the patterned first electrode and patterning the second electrode on the one or more layers of organic material includes: blanket depositing the layers of organic material over an area of the source substrate; blanket depositing the second electrode over the layers of organic material; forming a patterned protective layer over the second electrode, the patterned protective layer defining the pattern of the one or more layers of organic material; patterning the second electrode by exposing the second electrode to an active material that removes second electrode material exposed to the line-of-flight of the active material; and patterning the one or more layers of organic material by exposing the one or more layers of organic material to an active material that removes the one or more layers of organic material exposed to the line-of-flight of the active material.

In certain embodiments, patterning the one or more layers of organic material on the patterned first electrode and patterning the second electrode on the one or more layers of organic material includes: removing the patterned protective layer.

In certain embodiments, patterning the one or more layers of organic material on the patterned first electrode and patterning the second electrode on the one or more layers of organic material includes: providing additional patterned second electrode material to form the patterned second electrode and protect the one or more layers of organic material.

In certain embodiments, the organic light-emitting diode is a top emitter.

In certain embodiments, the organic light-emitting diode is a bottom emitter.

In certain embodiments, the organic-light emitting diode a light-emissive area of less than 1600 square microns, less than or equal to 800 square microns, less than or equal to 400 square microns, less than or equal to 200 square microns, less than or equal to 100 square microns, or less than or equal to 50 square microns.

In certain embodiments, the organic-light emitting diode has at least one of a width from 5 to 10 µm, 10 to 20 µm, or 20 to 50 µm, a length from 5 to 10 µm, 10 to 20 µm, or 20 to 50 µm, and a height from 2 to 5 µm, 4 to 10 µm, 10 to 20 µm, or 20 to 50 µm.

In another aspect, the disclosed technology includes a wafer of printable organic light-emitting diodes, including: a source substrate; a plurality of organic light-emitting diodes formed on the substrate, each organic light-emitting diode having a first electrode, one or more layers of organic material disposed on at least a portion of the first electrode, and a second electrode disposed on at least a portion of the one or more layers of organic material; one or more anchors on the source substrate; and a plurality of tethers, each organic light-emitting diode releasably secured to the source substrate by at least one anchor and at least one tether.

In certain embodiments, the wafer includes a sacrificial layer at least partially between the organic light-emitting diodes and the source substrate, wherein the plurality of organic light-emitting diodes are disposed on the sacrificial layer.

In certain embodiments, an oxide layer or a pre-determined designated portion of the source substrate.

In certain embodiments, the sacrificial layer comprises a cavity between the organic light-emitting diode and the source substrate.

In certain embodiments, there is an air gap between the organic light-emitting diodes and the source substrate.

In certain embodiments, the one or more layers of organic material in each of the organic light-emitting diodes is the same.

In certain embodiments, at least one of the one or more layers of organic material emits red light, green light, or blue light when a current is applied thereto.

In certain embodiments, at least ten thousand, one-hundred thousand, one million, or ten million OLEDs are on the source substrate.

In certain embodiments, the organic light-emitting diodes are top emitter.

In certain embodiments, the organic light-emitting diodes are bottom emitters.

In certain embodiments, the organic-light emitting diodes have a light-emissive area of less than 1600 square microns, less than or equal to 800 square microns, less than or equal to 400 square microns, less than or equal to 200 square microns, less than or equal to 100 square microns, or less than or equal to 50 square microns.

In certain embodiments, the organic-light emitting diodes have at least one of a width from 5 to 10 µm, 10 to 20 µm, or 20 to 50 µm, a length from 5 to 10 µm, 10 to 20 µm, or 20 to 50 µm, and a height from 2 to 5 µm, 4 to 10 µm, 10 to 20 µm, or 20 to 50 µm.

Organic light emitters have better power conversion efficiencies at low current density than some inorganic light emitters. It is an object of the present invention to provide organic emitters that supplement the emitter population of displays made from assemblies of micro scale inorganic LEDs. It is also an object of the present invention to provide photoluminescent down-converters for blue or violet micro-assembled inorganic LEDs.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2A-2I are cross sections of successive structures useful in making the structure of FIG. 1 in an embodiment of the present invention;

FIGS. 4A and 4B are top views and bottom views respectively of the structure in FIG. 3 in an embodiment of the present invention;

FIGS. 5A-5J are cross sections of successive structures useful in making the structure of FIG. 3 in an embodiment of the present invention;

Figure 1:
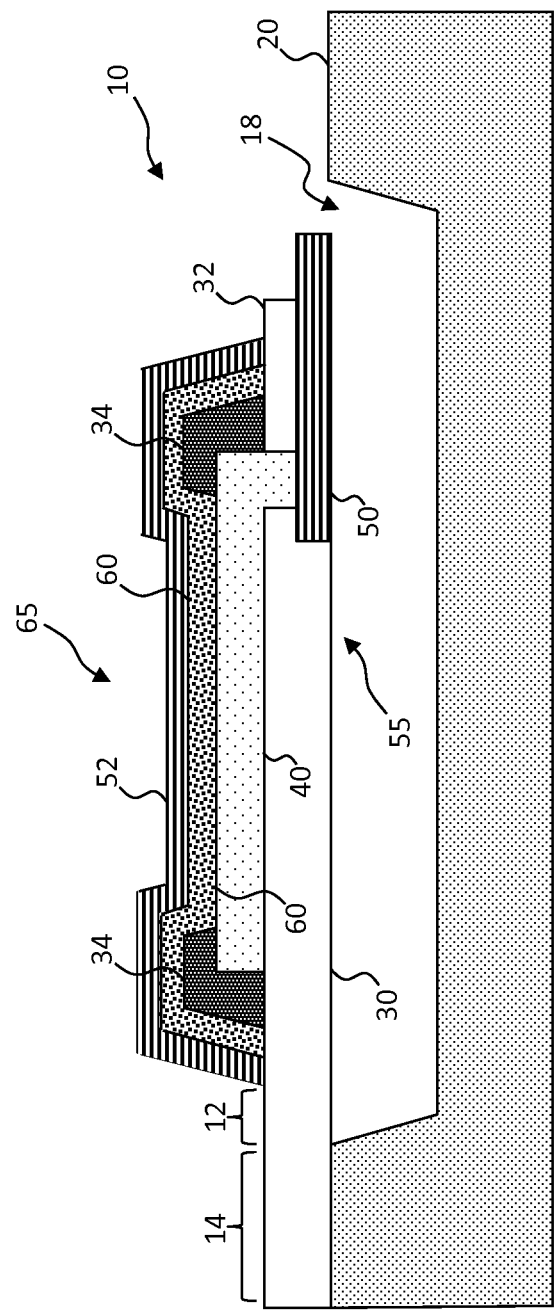
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the cross section of FIG. 1, in an embodiment of the present invention an organic light-emitting diode (OLED) structure 10 includes an organic light-emitting diode 65 having a first electrode 55, one or more layers of organic material 60 disposed on at least a portion of the first electrode 55, and a second electrode 52 disposed on at least a portion of the one or more layers of organic material 60. The OLED structure 10 includes at least a portion of a tether 12 extending from a periphery of the organic light-emitting diode 65. In an embodiment, the OLED structure 10 is a micro transfer printable OLED 65.

In the embodiment of FIG. 1, the first electrode 55 includes a first electrode portion 50 and a transparent electrode 40 that is in electrical contact with the first electrode portion 50. The first electrode portion 50 can be opaque, for example made of an electrically conductive metal such as aluminum, silver, gold, tungsten, or titanium. The transparent electrode 40 can be any transparent conductor such as a transparent conductive metal oxide such as indium tin oxide or aluminum zinc oxide. The second electrode 52 can be a metal layer made of a conductive metal such as aluminum, silver, gold, tungsten, or titanium and can be made of the same material as the first electrode portion 50, or a different material.

The OLED 65 can be constructed on a transparent insulator 30 and an insulator 32. The insulator 32 can be transparent and comprise the same material as the transparent insulator 30 or the insulator 32 can be a different, opaque material. The transparent insulator 30 or insulator 32 can be, for example, silicon dioxide or silicon nitride. The transparent electrode 40 is formed at least partly on the transparent insulator 30 and the transparent insulator 30 is at least partly in a common layer with the opaque first electrode portion 50. The transparent insulator 30 transmits light emitted from the one or more layers of organic material 60. The insulator 32 electrically insulates the first electrode portion 50 from the second electrode 52 so that a voltage difference can be established between the first and second electrodes 55, 52 causing current to flow between the first and second electrodes 55, 52 through the one or more layers of organic material 60, causing at least one of the one or more layers of organic material 60 to emit light.

The insulator 32 prevents electrical shorts between the first electrode portion 50 and the second electrode 52 and allows the first electrode 55 to extend beyond the second electrode 52 enabling an external electrical connection to the first electrode 55, for example an external electrical connection on a display substrate (not shown in FIG. 1).

The one or more layers of organic material 60 can be evaporatively deposited on the transparent electrode 40 and can include a hole-injection layer, a light-emitting layer, and an electron-injection layer. Bank insulators 34 formed on the edges or corners of the transparent electrode 40 prevents electrical shorts between the transparent electrode 40 and the second electrode 52 at the edges or corners of the transparent electrode 40.

The OLED structure 10 includes a tether 12 physically connecting the OLED 65 extending from a periphery of the organic light-emitting diode 65. In the embodiment of FIG. 1, the tether 12 is an extension of the transparent insulator 30 beyond the OLED 65 and is attached to a portion of a source substrate 20 forming an anchor 14. A sacrificial layer 18 is formed beneath the OLED structure 10 so that the OLED structure 10 is only connected to the source substrate 20 by the tether 12 to the anchor 14. Thus, the OLED structure 10 can be released from the source substrate 20 by contacting the OLED 65 with a stamp, pressing the stamp against the OLED 65 to fracture the tether 12. The OLED 65 can then be micro transfer printed to a destination substrate such as a display substrate (not shown in FIG. 1).

The sacrificial layer 18 can be a cavity that is etched out from under the OLED 65 to form the tether 12 and OLED structure 10. Alternatively, according to embodiments of the present invention, the sacrificial layer 18 is a physical layer, such as an oxide layer on the source substrate 20 on which the OLED 65 is constructed. In another embodiment, the source substrate 20 is a semiconductor substrate, such as silicon (1 0 0) or silicon (1 1 1), and the sacrificial layer 18 is a pre-determined designated portion of the source substrate 20.

Figure 2A:
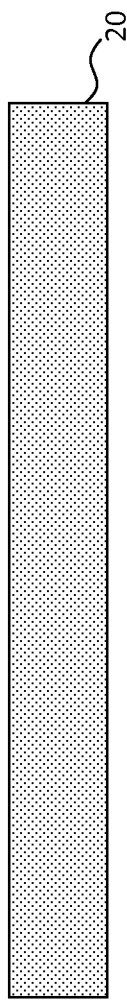
Figure 11:
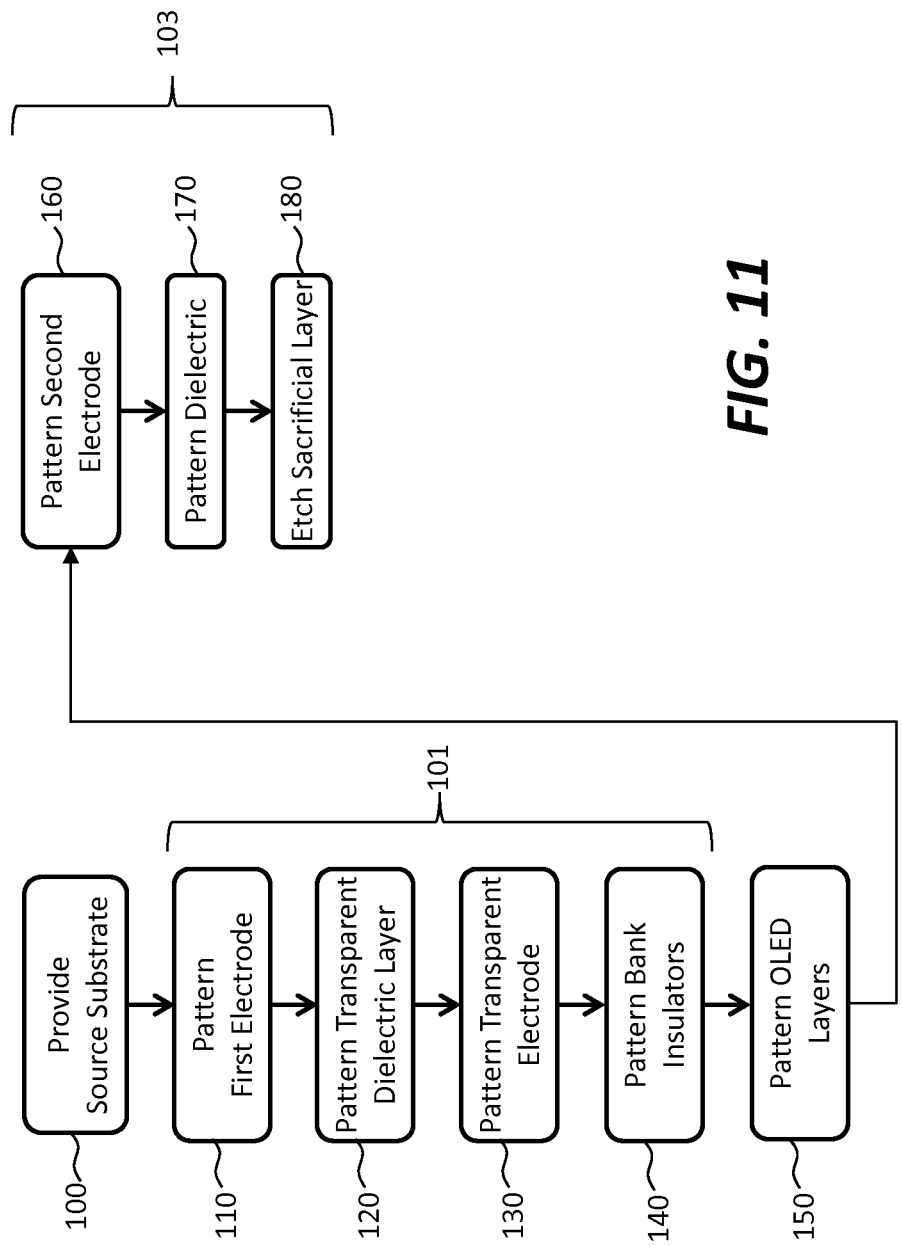
FIGS. 11 and 12 are flow diagrams illustrating methods in various embodiments of the present invention.

The cross sections of FIGS. 2A-2I and the flow diagram of FIG. 11 illustrate successive steps in making an embodiment of the present invention. As shown in FIG. 2A, a source substrate 20 is provided in step 100. The source substrate 20 can be any substrate on which the subsequent structures can be formed and can include a glass, plastic, or semiconductor substrate having opposing substantially planar surfaces on which lithographic processes can be performed. The embodiment described uses a semiconductor substrate, for example silicon (1 0 0) or silicon (1 1 1).

For clarity and brevity of exposition, in the following steps and also with respect to FIGS. 5A-5J, repeated references are made to forming a patterned layer or structure. Patterned layers are typically made in the photolithographic arts by first depositing a blanket layer of a desired material, for example by evaporation or sputtering. A blanket layer is unpatterned and covers the exposed area of a substrate. A photoresist layer, either positive or negative and for example SU8, is then deposited in a blanket layer over the desired material and exposed to a pattern of electromagnetic radiation such as ultra-violet radiation to pattern-wise cure the photoresist. The uncured photoresist is then removed to expose a pattern of the desired material. The exposed desired material is then etched, for example with a wet etchant, a dry etch, a plasma, reactive ions, or other active materials to remove the exposed desired material. Optionally, the cured photoresist is then removed, for example using an etchant specific to the cured photoresist, leaving a pattern of the desired material.

Figure 2B:
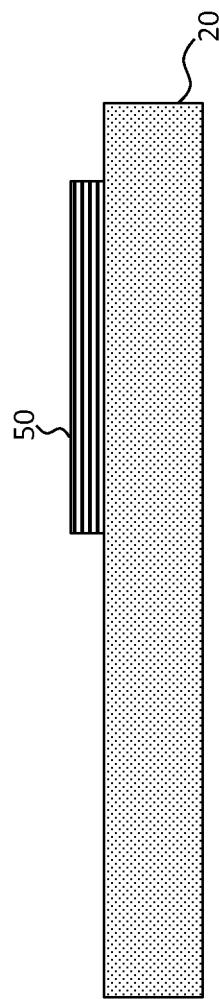

Referring to FIG. 2B, a first electrode portion 50 is deposited and patterned on or in the source substrate 20 in step 110. For example, the first electrode portion 50 can be a metal such as aluminum, titanium, tungsten, gold, silver, or other electrically conductive materials including conductive inks, semiconductors, or doped semiconductors.

Figure 2C:
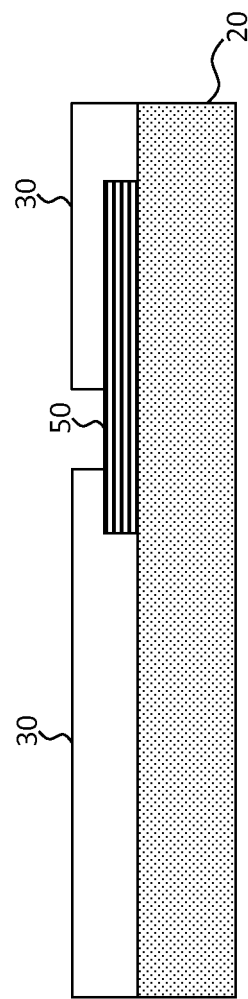

A layer of transparent insulator 30 is patterned over the first electrode portion 50 in step 120, leaving an exposed gap in the transparent insulator 30, as shown in FIG. 2C. A suitable transparent insulator 30 is silicon nitride or silicon dioxide. The transparent insulator 30 can be partially transparent, for example 50%, 70%, 80%, 90%, or 95% transparent to visible light. Two portions of transparent insulator 30 (a left and a right portion) are shown in FIG. 2C. The right portion can be opaque and does not need to be transparent. As shown in FIG. 1, the right portion of the insulating layer is labeled as 32, an insulator and can be formed and patterned separately from the transparent insulator 30 and can be a different material than the transparent insulator 30. In an embodiment, however, both the transparent insulator 30 and insulator 32 of FIG. 1 are transparent and are made in a common process with common materials so that the insulator 32 is also a transparent insulator 30.

Figure 2D:
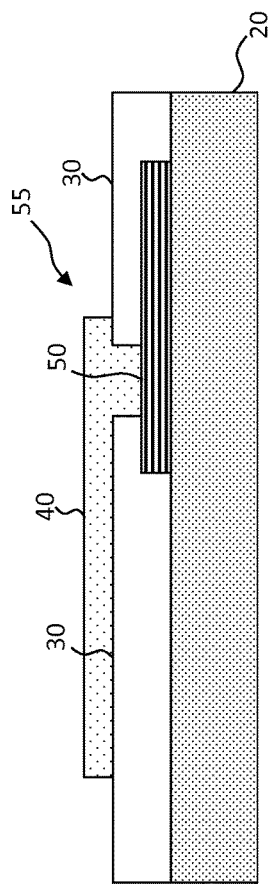
Figure 2E:
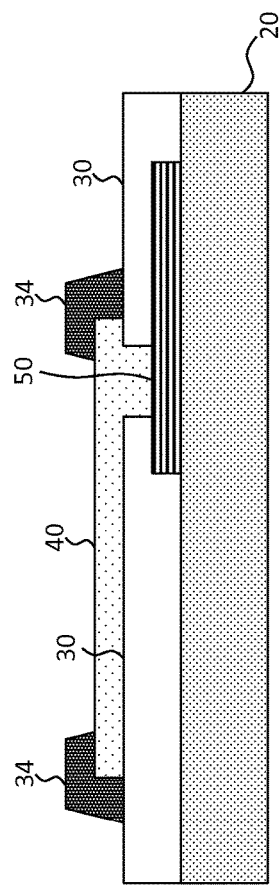

Referring next to FIG. 2D, in step 130 a transparent electrode 40 is patterned over the transparent insulator 30 and in electrical contact with the first electrode portion 50. The transparent electrode 40 is therefore in electrical contact with the first electrode portion 50 and the first electrode 55 includes both the first electrode portion 50 and the transparent electrode 40. As shown in FIG. 2E, bank insulators 34 are formed and patterned in step 140 on the edges of the transparent electrode 40. The bank insulators 34 can be made of the same materials as the transparent insulator 30 or insulator 32, or a different insulating material. The bank insulators 34 can, but need not, be transparent.

Figure 2F:
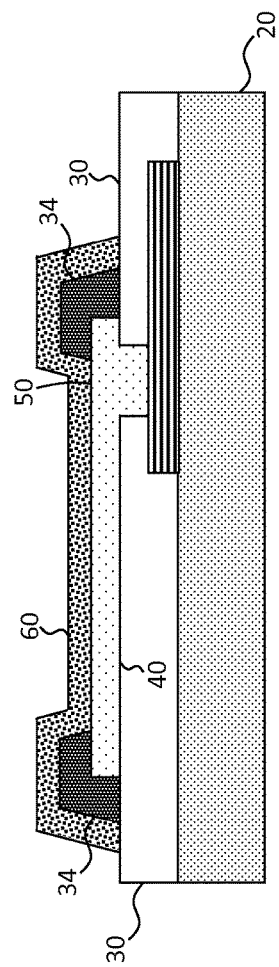

As shown in FIG. 2F, one or more layers of organic material 60 are patterned over the transparent electrode 40 in step 150. The one or more layers of organic material 60 can extend, but need not extend, over the bank insulators 34 and transparent insulators 30 (and insulator 32 as shown in FIG. 1). In an embodiment, the one or more layers of organic material 60 are deposited by evaporation and patterned with a fine metal mask placed over the transparent conductor 40 and the bank insulators 34. The fine metal mask has openings corresponding to the areas in which it is desired to deposit the organic layers, for example the exposed portion of the transparent electrode 40 between the bank insulators 34. Elsewhere, any evaporated organic material is deposited on the fine metal mask. Alternatively, the one or more layers of organic material 60 are patterned using photolithographic processes described below.

Referring next to FIG. 2G, the second electrode 52 is patterned over the one or more layers of organic material 60 in step 160. The first and second electrodes 55, 52 and the one or more layers of organic material 60 form an organic light-emitting diode or OLED 65. When a voltage is supplied across the first and second electrodes 55, 52 so that an electrical current flows between the first and second electrodes 55, 52 through the one or more layers of organic material 60, light is emitted from one or more of the organic material layers.

Figure 2H:
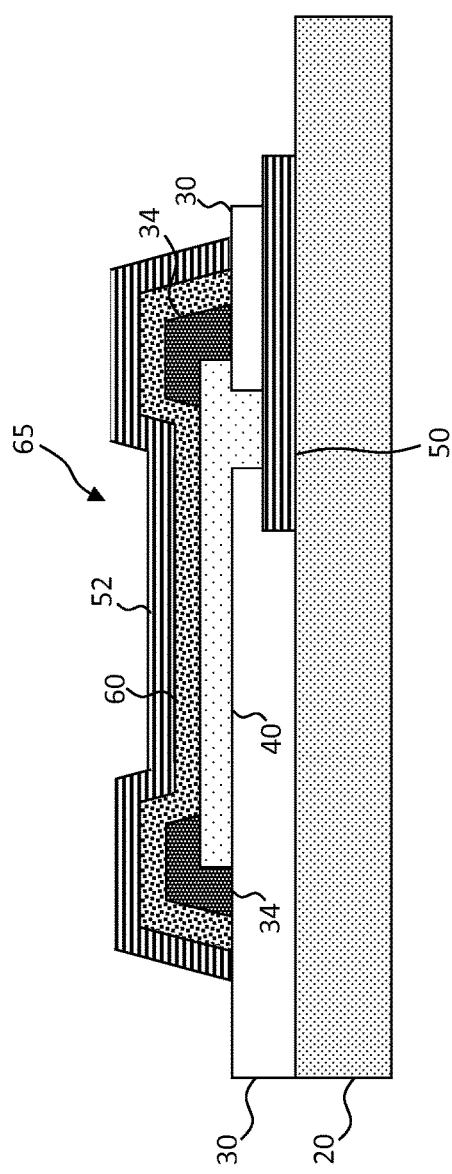
Figure 2I:
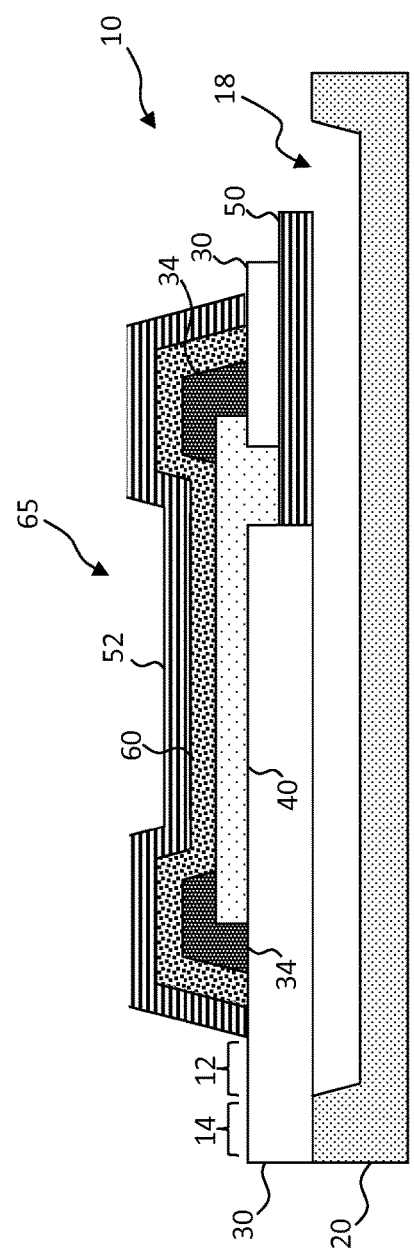

As shown in FIG. 2H, the transparent insulator 30 or insulator 32 (FIG. 1) is further patterned to expose the first electrode portion 50 in step 170. The sacrificial layer 18 is then removed in step 180 from beneath the first electrode portion 50 and transparent insulator (dielectric) 30, for example by etching (FIG. 2I). In one embodiment of the present invention, the sacrificial layer 18 is simply a portion of the source substrate 20 that is etched, for example to form a cavity, as illustrated in FIGS. 1 and 2I. In another embodiment a layer different from the source substrate 20 is patterned on the source substrate 20, for example an oxide or nitride layer. The OLED structure 10 is formed on the sacrificial layer 18, with the optional addition of an etch stop layer to protect the OLED structure 10 from the sacrificial layer 18 etch when it is removed in step 180 to form a cavity. After etching, the sacrificial layer 18 is a cavity.

Figure 10:
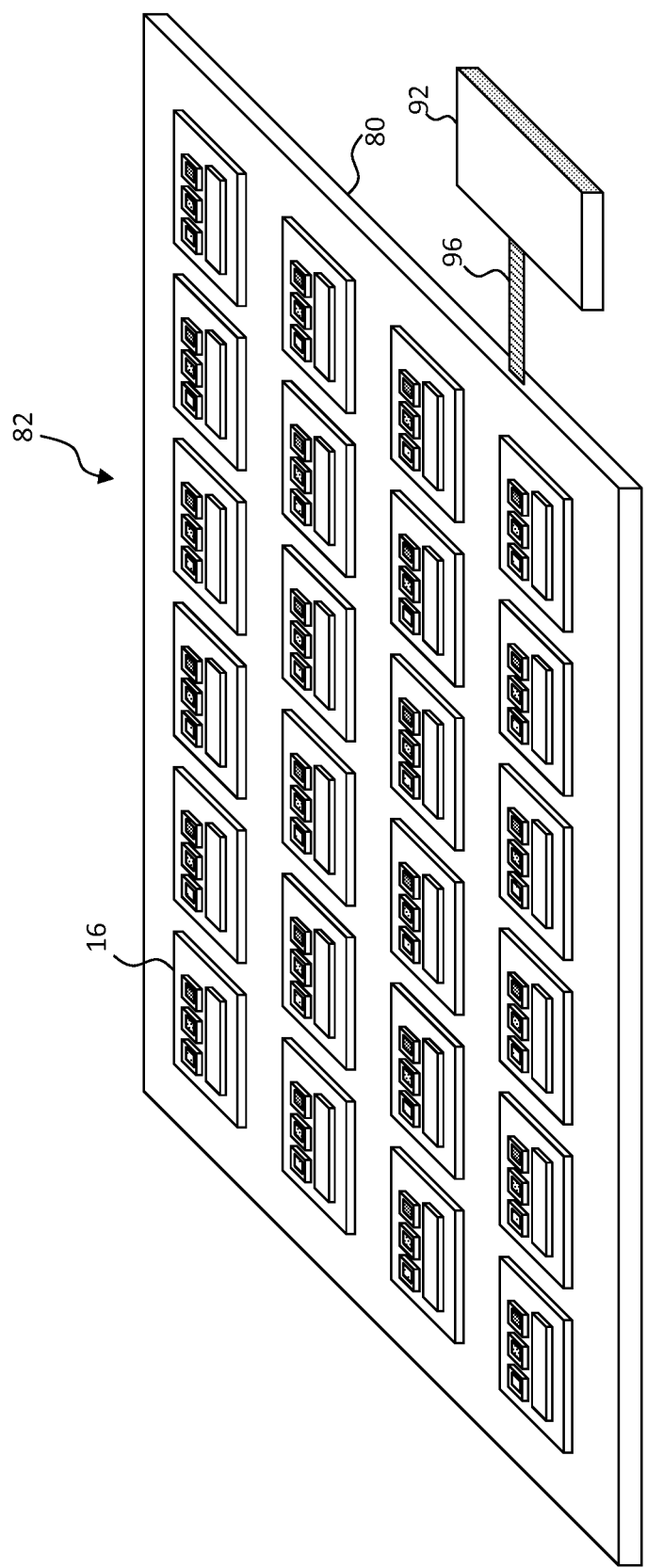
FIG. 10 is a perspective of a display in an embodiment of the present invention using the pixels of FIG. 9.

The sacrificial layer 18 is patterned on the source substrate 20 so that the OLED 65 is completely undercut and so that a tether 12 extends from the periphery or edge of the OLED 65 to an anchor 14. The anchor 14 can be a portion of the source substrate 20 that is not removed when the sacrificial layer 18 is removed to form the cavity. The tether 12 can be a portion of the transparent insulator 30 (as shown) or a portion of the first or second metal electrodes 55, 52, or the bank insulator 34 (as shown in FIG. 10 and discussed further below). Because of the tether 12, anchor 14, and underlying sacrificial layer 18, the OLED structure 10 is suitable for micro transfer printing. During the micro transfer printing process, the tether 12 is fractured leaving only a portion of the tether 12 as a part of the OLED structure 10 of the present invention, and the OLED structure 10 can be transferred to a destination substrate such as a display substrate.

The OLED structure 10 of FIG. 1 and as made by the process described in FIGS. 2A-2I includes first and second electrodes 55, 52. After the OLED structure 10 is micro transfer printed to a destination substrate, conventional photolithographic methods can be used to electrically connect the first and second electrodes 55, 52 to a control, power, or ground circuit.

Figure 3:
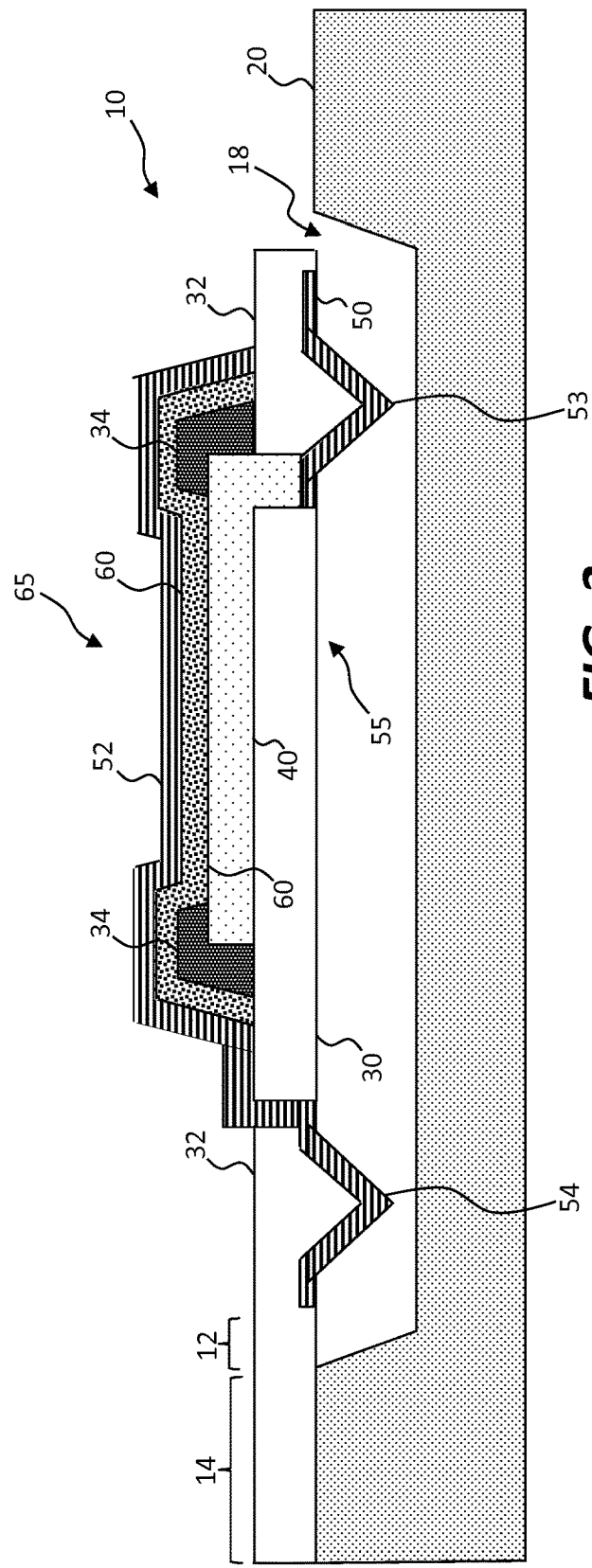
FIG. 3 is a cross section of an alternative embodiment of the present invention.

An alternative OLED structure 10 according to an embodiment of the present invention is illustrated in FIG. 3 and a method of making the OLED structure 10 is illustrated in the successive cross section illustrations of FIGS. 4A-4L. As shown in FIG. 3, the first electrode 55 includes a first protrusion 53 and the second electrode 52 includes a second protrusion 54 spatially and electrically separate from the first protrusion 53. The first and second protrusions 53, 54 extend in a direction from the second electrode 52 to the first electrode 55, i.e., toward the source substrate 20. The remainder of the OLED 65 and OLED structure 10 are similar to those described above with respect to FIG. 1.

FIGS. 4A and 4B illustrate top and bottom views of the OLED structure 10 of FIG. 3 respectively, excluding the source substrate 20 and the transparent insulator 30 in the bottom view. As viewed from the top and as shown in FIG. 4A, the OLED structure 10 includes a first electrode portion 50 extending to one side of the OLED structure 10. The insulator 32 separates the first electrode portion 50 from the second electrode 52. The insulator 32 (which can be the transparent insulator 30) extends to the other side of the OLED structure 10 and, where it extends past the protrusion 54, forms the tether 12.

As viewed from the bottom and as shown in FIG. 4B, the OLED structure 10 includes a first electrode portion 50 extending to one side of the OLED structure 10. The transparent insulator 30 separates the first electrode portion 50 from the bank insulator 34. The one or more layers of organic material 60 can (but need not) extend past the bank insulator 34 and the second electrode 52 likewise can (but need not) extend past the one or more layers of organic material 60. The insulator 32 (which can be the transparent insulator 30) extends to the other side of the OLED structure 10 and, where it extends past the protrusion 54 (which is a portion of the second electrode 52), forms the tether 12.

The cross sections of FIGS. 5A-5J and the flow diagram of FIG. 11 illustrate successive steps in making an embodiment of the present invention. As shown in FIG. 5A, a source substrate 20 is provided in step 100 with spatially separated indentations formed in the source substrate 20, for example by anisotropic etching, above a portion of the source substrate 20 pre-defined as the sacrificial layer 18. The source substrate 20 can be any substrate on which the subsequent structures can be formed and can include a glass, plastic, or semiconductor substrate having opposing substantially planar surfaces on which lithographic processes can be performed. The embodiment described uses a semiconductor substrate, for example silicon (1 0 0) or silicon (1 1 1).

Referring to FIG. 5B, in step 110 a first electrode portion 50 is deposited and patterned on or in one of the indentations in the source substrate 20 and a portion of the second electrode 52 is deposited and patterned on or in the other of the indentations in the source substrate 20. For example, the first electrode portion 50 or second electrode portions 52 can be a metal such as aluminum, titanium, tungsten, gold, silver, or other electrically conductive materials including conductive inks, semiconductors, or doped semiconductors.

A layer of transparent insulator 30 is patterned over the first electrode portion 50 in step 120, leaving an exposed gap in the transparent insulator 30, as shown in FIG. 2C. A suitable transparent insulator 30 is silicon nitride or silicon dioxide. The transparent insulator 30 can be partially transparent, for example 50%, 70%, 80%, 90%, or 95% transparent to visible light. A transparent insulator 30 is shown on the left in FIG. 5C. The right portion can be opaque and does not need to be transparent. As shown in FIG. 3, the right portion of the insulating layer is labeled as 32, an insulator and can be formed and patterned separately from the transparent insulator 30 and can be a different material than the transparent insulator 30. In an embodiment, however, both the transparent insulator 30 and insulator 32 of FIG. 1 are transparent and are made in a common process with common materials so that the insulator 32 is also a transparent insulator 30.

Referring next to FIG. 5D, in step 130 a transparent electrode 40 is patterned over the transparent insulator 30 and in electrical contact with the first electrode portion 50. The transparent electrode 40 is therefore in electrical contact with the first electrode portion 50 and the first electrode 55 includes both the first electrode portion 50 and the transparent electrode 40. As shown in FIG. 5E, a via is opened in the transparent insulator 30 to expose a portion of the second electrode 52. In an embodiment, this step is combined with the step illustrated in FIG. 5F. As shown in FIG. 5F, bank insulators 34 are formed and patterned in step 140 on the edges of the transparent electrode 40. The bank insulators 34 can be made of the same materials as the transparent insulator 30 or insulator 32, or a different insulating material. The bank insulators 34 can, but need not, be transparent.

As shown in FIG. 5G, one or more layers of organic material 60 are patterned over the transparent electrode 40 in step 150. The one or more layers of organic material 60 can, but need not, extend over the bank insulators 34 and transparent insulators 30 (and insulator 32 as shown in FIG. 3). In an embodiment, the one or more layers of organic material 60 are deposited by evaporation and patterned with a fine metal mask placed over the transparent conductor 40 and the bank insulators 34. The fine metal mask has openings corresponding to the areas in which it is desired to deposit the organic layers; for example, the exposed portion of the transparent electrode 40 between the bank insulators 34. Elsewhere, any evaporated organic material is deposited on the fine metal mask. Alternatively, the one or more layers of organic material 60 are patterned using photolithographic processes described below.

Referring next to FIG. 5H, the second electrode 52 is patterned over the one or more layers of organic material 60 in step 160 and is formed in electrical contact with the portion of the second electrode 52 through the via. The first and second electrodes 55, 52 and the one or more layers of organic material 60 form an organic light-emitting diode or OLED 65. When a voltage is supplied across the first and second electrodes 55, 52 so that an electrical current flows between the first and second electrodes 55, 52 through the one or more layers of organic material 60, light is emitted from one or more of the organic material layers.

As shown in FIG. 5I, the transparent insulator 30 or insulator 32 (FIG. 1) is further patterned to expose the first electrode portion 50 in step 170. The sacrificial layer 18 is then removed in step 180 from beneath the first electrode portion 50 and transparent insulator (dielectric) 30, for example by etching (FIG. 5J). In one embodiment of the present invention, the sacrificial layer 18 is simply a portion of the source substrate 20 that is etched, for example etched to form a cavity, as illustrated in FIGS. 3 and 5J. In another embodiment a layer different from the source substrate 20 is patterned on the source substrate 20, for example an oxide or nitride layer. The OLED structure 10 is formed on the sacrificial layer 18, with the optional addition of an etch stop layer to protect the OLED structure 10 from the sacrificial layer 18 etch when it is removed in step 180 to form a cavity. After etching, the sacrificial layer 18 is a cavity.

The sacrificial layer 18 is patterned on the source substrate 20 so that the OLED 65 is completely undercut and so that a tether 12 extends from the periphery or edge of the OLED 65 to an anchor 14. The anchor 14 can be a portion of the source substrate 20 that is not removed when the sacrificial layer 18 is removed to form the cavity. The tether 12 can be a portion of the transparent insulator 30 (as shown) or a portion of the first or second metal electrodes 55, 52, or the bank insulator 34 (as shown in FIG. 10 and discussed further below). Because of the tether 12, anchor 14, and underlying sacrificial layer 18, the OLED structure 10 is suitable for micro transfer printing. During the micro transfer printing process, the tether 12 is fractured leaving only a portion of the tether 12 as a part of the OLED structure 10 of the present invention, and the OLED structure 10 can be transferred to a destination substrate such as a display substrate.

The OLED structure 10 of FIG. 1 and as made by the process described in FIGS. 2A-2I includes first and second electrodes 55, 52. In certain embodiments, one or more steps may be omitted. After the OLED structure 10 is micro transfer printed to a destination substrate, conventional photolithographic methods can be used to electrically connect the first and second electrodes 55, 52 to a control, power, or ground circuit.

Figure 6:
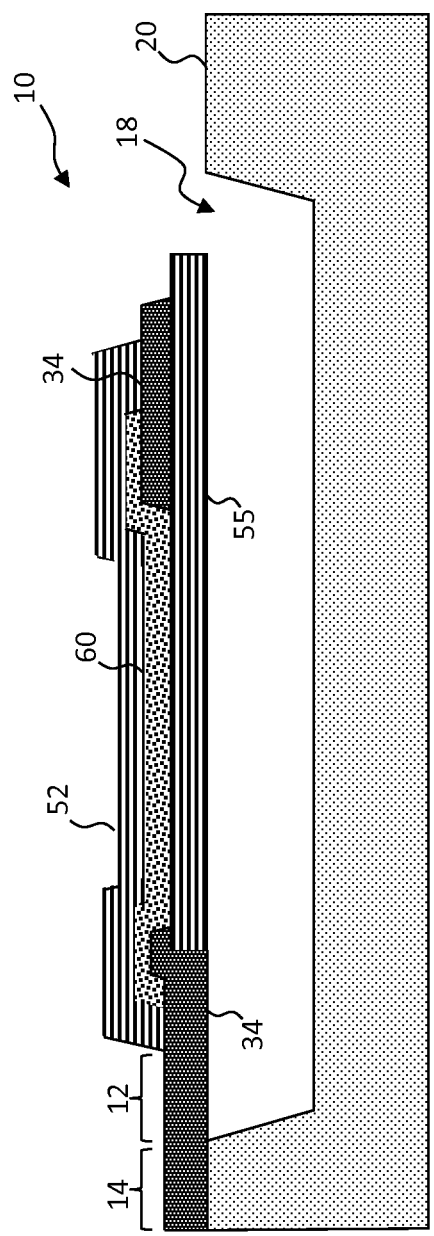
FIG. 6 is a cross section of an alternative top-emitter or bottom-emitter embodiment of the present invention.

Another embodiment of the present invention illustrate in the cross section of FIG. 6 uses a unitary first electrode 55. By unitary it is meant that the first electrode 55 consists of only one kind of material in a single structure in contrast to the first electrode 55 of the embodiments of FIGS. 1 and 3, in which the first electrode 55 has two parts, a first electrode portion 50 and a transparent electrode portion 40. As shown in FIG. 6, the separate transparent electrode 40 is omitted and the tether 12 is formed by the bank insulator 34. The structure shown in FIG. 6 can also be used with the first and second protrusions 53, 54 shown in the embodiment of FIG. 3.

The evaporated organic materials can be patterned by using a fine metal shadow mask that prevents the deposition of organic particles on portions of a substrate covered by the shadow mask. In an embodiment of the present invention, the organic materials are patterned using photolithographic methods. Because the present invention contemplates the deposition of only a single set of organic materials on a source substrate 20 and multiple colors in a display are provided with different sets of organic materials on respective different source substrates 20 rather than on a common substrate, the photolithographic process do not damage pre-existing layers of organic materials.

Figure 7A:
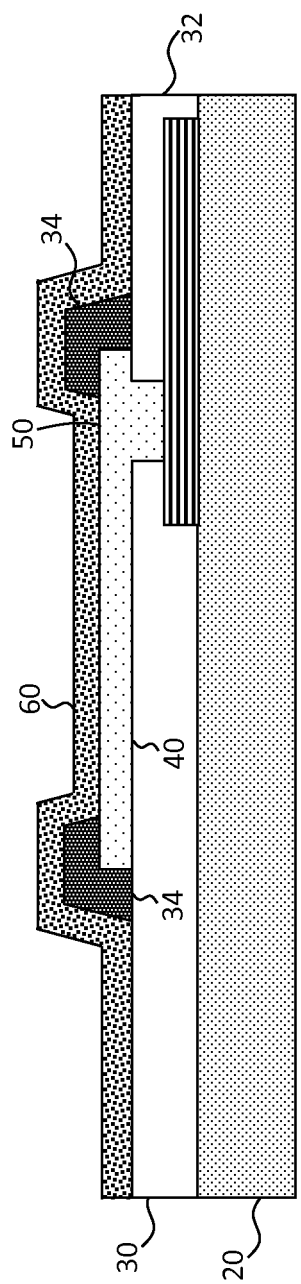
FIGS. 7A-7O are cross sections of successive structures useful in making the structures of FIGS. 1, 3, and 5 in an alternative embodiment of the present invention that does not require shadow masks.
Figure 7B:
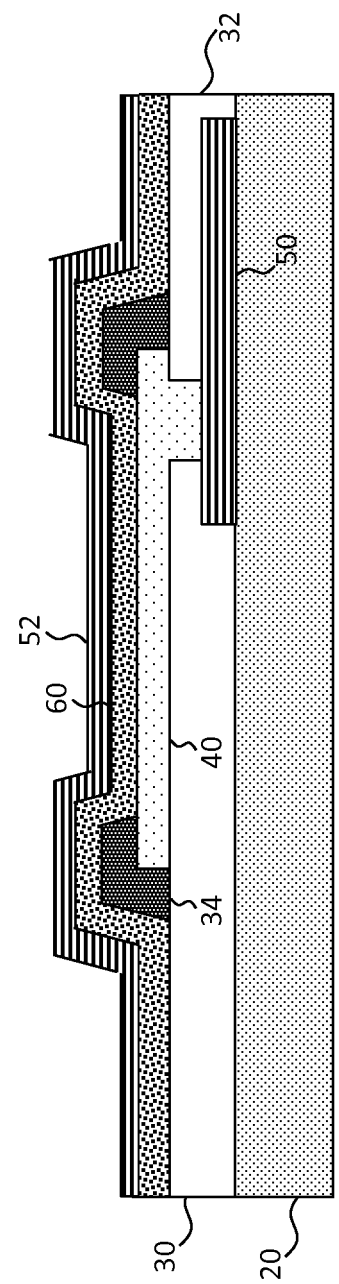

FIG. 7A illustrates a portion of an OLED structure 10 corresponding to the structures of FIGS. 2F and 5G except that the one or more layers of organic material 60 are unpatterned. Referring to FIG. 7B, an unpatterned layer of electrically conductive material comprising the second electrode 52 is deposited on the unpatterned one or more layers of organic material 60.

Next, as shown in FIG. 7C, a protective layer 70 is patterned on the unpatterned second electrode 52 and then exposed to an active material, such as an etchant, a dry etchant, an ion etchant, or a plasma. The active material removes the exposed portions of the second electrode 52 as shown in FIG. 7D. The process is then optionally repeated with the same or a different etchant (FIG. 7E) to form the patterned one or more layers of organic materials 60 illustrated in FIG. 7F.

Figure 7G:
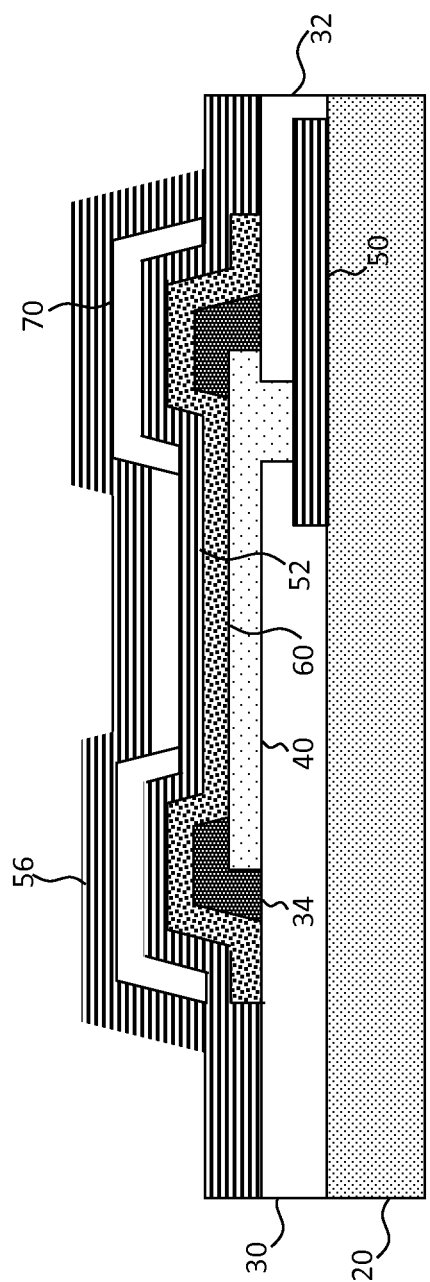
Figure 7H:
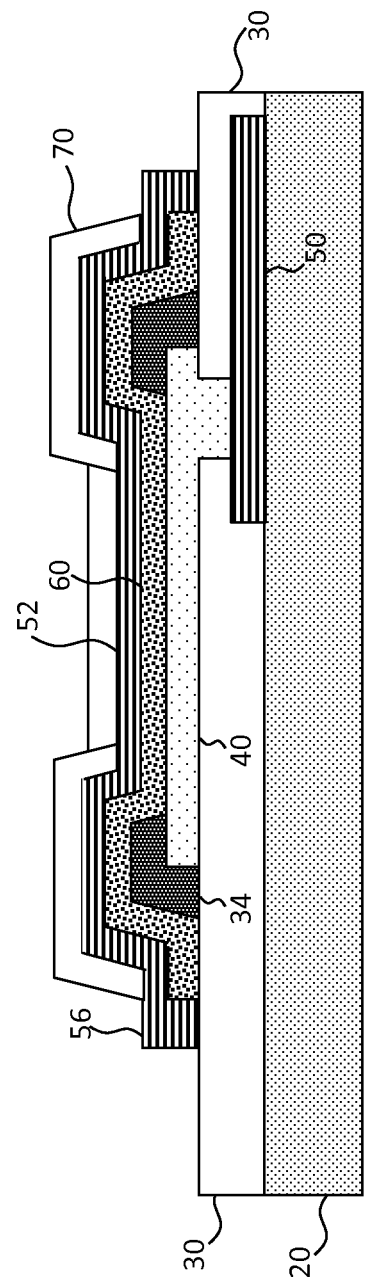
Figure 70:
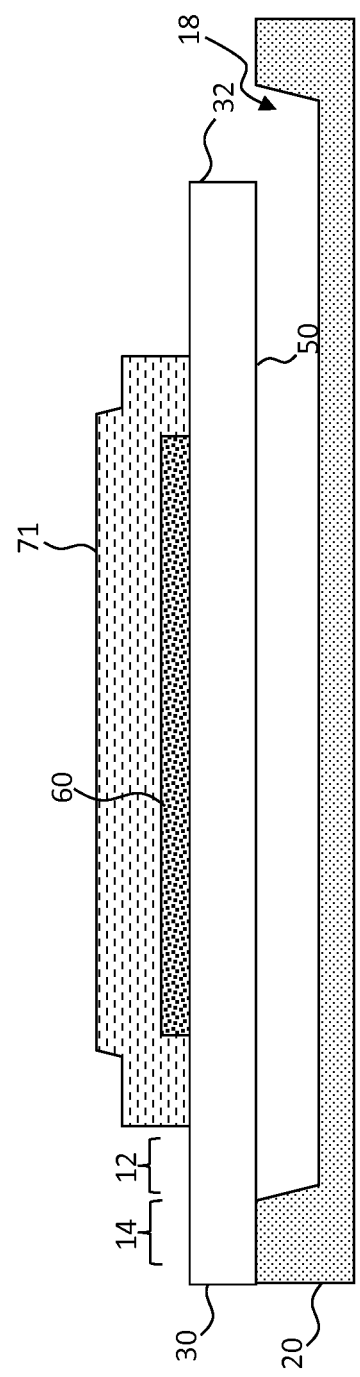

The patterned protective layer 70 is optionally removed (not shown) or coated with a second layer 56 of the electrical conductor of the second electrode 52 (FIG. 7G) and patterned to further protect any exposed edges of the one or more layers of organic materials 60 (FIG. 7H). If not removed earlier, the patterned protective layer 70 is optionally removed (FIG. 7I) and an additional layer of second electrode 52 material is optionally provided (FIG. 7J). After patterning the organic materials layer 60 a barrier material 71 may be deposited and patterned to encapsulate the organic materials and at least a portion of the second electrode 52, optionally having at least one opening to provide access to the second electrode 52. A third conductive layer 72 that like the barrier material 71 has moisture or environmental protection characteristics may be deposited and patterned over some portion of the organic materials and the second electrode, thereby forming (FIG. 7M) a protecting encapsulation layer composed of a combination of barrier material 71 and the third conductive layer 72. The insulator 32 is then patterned (FIG. 7K) and the sacrificial layer 18 etched (FIG. 7L) to form the OLED structure 10, optionally having the protecting encapsulation layer (FIG. 7N). In some embodiments, the organic structure is photoluminescent and contains only organic layers and transparent dielectric or barrier layers with no exposed electrical terminals (FIG. 7O).

Therefore, a method of patterning the one or more layers of organic material 60 on the patterned first electrode 55 and patterning the second electrode 52 on the one or more layers of organic material 60 includes blanket depositing the layers of organic material 60 over an area of the source substrate 20, blanket depositing the second electrode 52 over the layers of organic material 60, and forming a patterned protective layer 70 over the second electrode 52. The patterned protective layer defines the pattern of the one or more layers of organic material 60. The second electrode 52 is patterned by exposing the second electrode 52 to an active material that removes second electrode material exposed to the line-of-flight of the active material. The one or more layers of organic material 60 are patterned by exposing the one or more layers of organic material 60 to an active material that removes the one or more layers of organic material 60 exposed to the line-of-flight of the active material. The patterned protective layer is optionally removed. Additional patterned second electrode material is optionally provided to form the patterned second electrode 52 and protect the one or more layers of organic material 60. In an embodiment, the active material is a gas, a plasma, or not a liquid.

The process described in FIGS. 7A-7L does not require the use of fine metal shadow masks and is therefore not limited by the sizes of the mechanical structures inherent in the shadow masks. Instead, higher resolution photolithographic techniques are used and, in consequence, smaller OLED devices for higher resolution displays are possible. Therefore, according to an embodiment of the present invention, OLED 65 has a light-emitting area that has a dimension parallel to the extent of the first electrode 55 that is less than or equal to 40 microns, less than or equal to 20 microns, less than or equal to 10 microns, or less than or equal to 5 microns. Alternatively, or in addition, the OLED 65 has a light-emitting area that is less than or equal to 1600 square microns, less than or equal to 800 square microns, less than or equal to 400 square microns, less than or equal to 200 square microns, less than or equal to 100 square microns, or less than or equal to 50 square microns.

According to different embodiments of the present invention, the OLED structure 10 can have a top-emitter configuration or a bottom-emitter configuration. FIG. 1 and FIGS. 2A-2I illustrate a structure and method for a bottom-emitter embodiment in which light from the one or more layers of organic material 60 passes through the bottom, transparent electrode 40 and transparent insulator 30. Referring to FIG. 6, a top-emitter embodiment uses a unitary opaque first electrode 55 that extends between the bank insulators 34 and under the one or more layers of organic material 60. The bank insulators 34 are also helpful to insulate the transparent electrode 40 from the second electrode 52. The second electrode 52 is transparent, for example made of a metal oxide such as indium tin oxide or aluminum zinc oxide. In other embodiments, for example alternative configurations of FIGS. 1 and 3, the transparent electrode 40 is replaced with an opaque and preferably reflective electrode and the second electrode 52 is transparent. In these embodiments of the present invention, light emitted from the one or more layers of organic material 60 in response to current flowing between the first and second electrodes 55, 52 passes through the top, transparent second electrode 52.

As shown in FIGS. 1, 3, and 6, OLED structures 10 of the present invention can be constructed over a sacrificial layer 18 on a source substrate 20. The source substrate 20 has a portion defining an anchor 14 and the sacrificial layer 18 is formed on the source substrate 20 and adjacent to the anchor 14. The OLED 65 is disposed on the sacrificial layer 18 and the tether 12 is connected to the anchor 14. This OLED structure 10 is adapted for micro transfer printing to a destination substrate such as a display substrate.

According to further embodiments of the present invention, a plurality of OLED structures 10 are formed on the source substrate 20. In one embodiment, the one or more layers of organic material 60 in each of the OLED structures 10 is the same and at least one of the one or more layers of organic material 60 emits red light, green light, or blue light.

Alternatively, first and second OLED structures 10 are formed on the source substrate 20. The first OLED structure 10 includes at least one layer of organic material that emits a first color of light and the second OLED structure 10 includes at least one layer of organic material that emits a second color of light different from the first color of light. Additionally, a third OLED structure 10 can be formed on the source substrate 20 that includes at least one layer of organic material that emits a third color of light different from the first color of light and different from the second color of light. The first color of light can be red, the second color of light can be green, and the third color of light can be blue.

Figure 8:
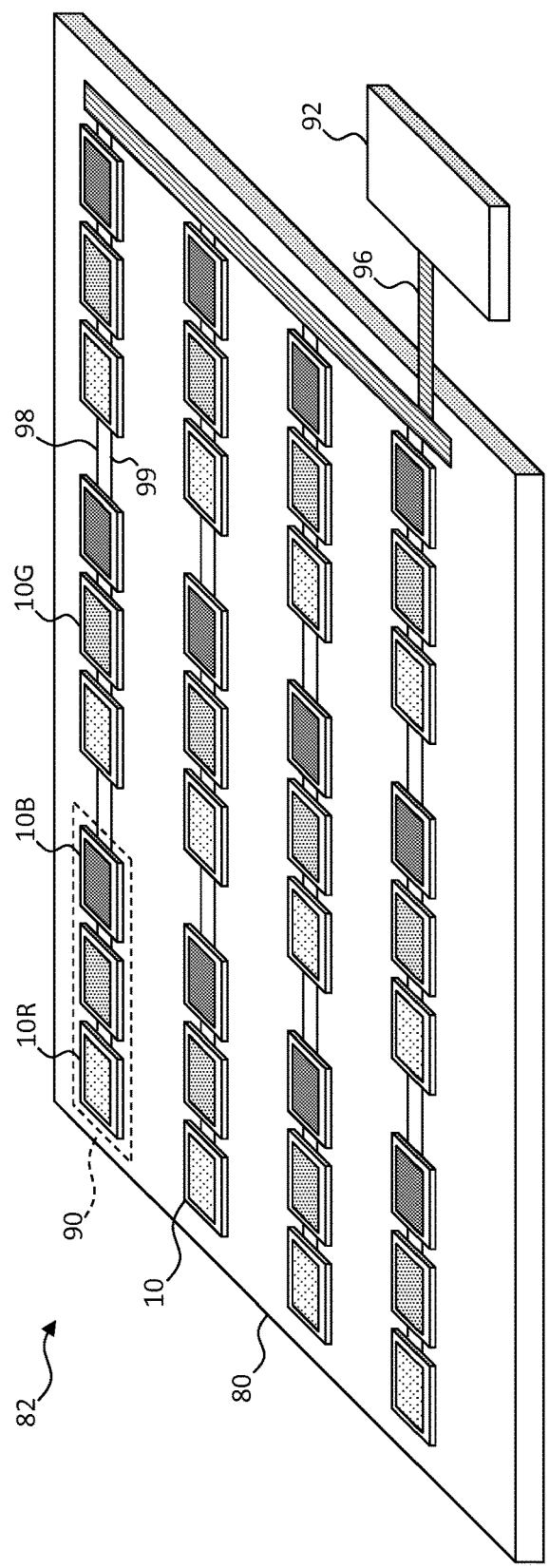
FIG. 8 is a perspective of a display in an embodiment of the present invention.

Referring to the perspective of FIG. 8, a micro transfer printed OLED display 82 having printable organic light-emitting diode structures 10 includes a display substrate 80 having one or more organic light-emitting diode structures 10 disposed on the display substrate 80. A first electrical conductor 98 is electrically connected to the first electrode 55 and a second electrical conductor 99 is electrically connected to the second electrode 52. In various embodiments, the first electrical conductor 98 or the second electrical conductor 99 is located on the display substrate 80 or the first and second electrical conductors 98, 99 are both located on the display substrate 80. The first and second electrical conductors 98, 99 can be connected to wires or form a bus 96 that is connected to a controller 92. The controller 92 provides signals, power, or ground through the wires 96 and the first and second electrical conductors 98, 99 to control the organic light-emitting diode structures 10 to emit light. Although for clarity, the OLED structures 10 are shown interconnected serially by the first and second electrical conductors 98, 99, in an alternative embodiment, the OLED structures 10 can be controlled using conventional column and row drivers.

The OLED structures 10 can be grouped into pixels 90. The pixels 90 can have OLED structures 10 that all emit the same color of light or the pixels 90 can be full-color pixels 90 that each have different OLED structures 10. For example, the pixels 90 can include at least a first OLED structure 10 that emits light of a first color and a second OLED structure 10 that emits light of a second color different from the first color. The pixels 90 can also include a third OLED structure 10 that emits light of third color different from the first and second colors. The colors can be red, green, and blue and the first OLED structure 10 can be a red OLED structure 10R that emits red light, the second OLED structure 10 can be a green OLED structure 10G that emits green light, and the third OLED structure 10 can be a blue OLED structure 10B that emits blue light.

In an alternative embodiment of the present invention, not shown, a color display includes both organic light-emitting diodes and inorganic light-emitting diodes. Thus, the one or more OLED structures 10 can include a first OLED structure 10 that emits light of a first color and a second inorganic light-emitting diode that emits light of a second color different from the first color. Both the organic and inorganic light-emitting diodes can be micro transfer printed from a source substrate 20 to the display substrate 80 to form a heterogeneous display. For example, the red light emitter can be a red OLED and the green and blue light emitters can be inorganic light emitters.

In a further embodiment of the present invention the display includes pixel controllers 94 (shown in FIG. 9) associated with or a part of the pixels 90 that are electrically connected to the first and second electrodes 55, 52 of the OLED structures 10 in the pixel 90 group to control the OLED structures 10 to emit light. The pixel controllers 94 can be an integrated circuit that includes control circuits responsive to the controller 92 through the wires 96 and first and second electrical conductors 98, 99.

Figure 9:
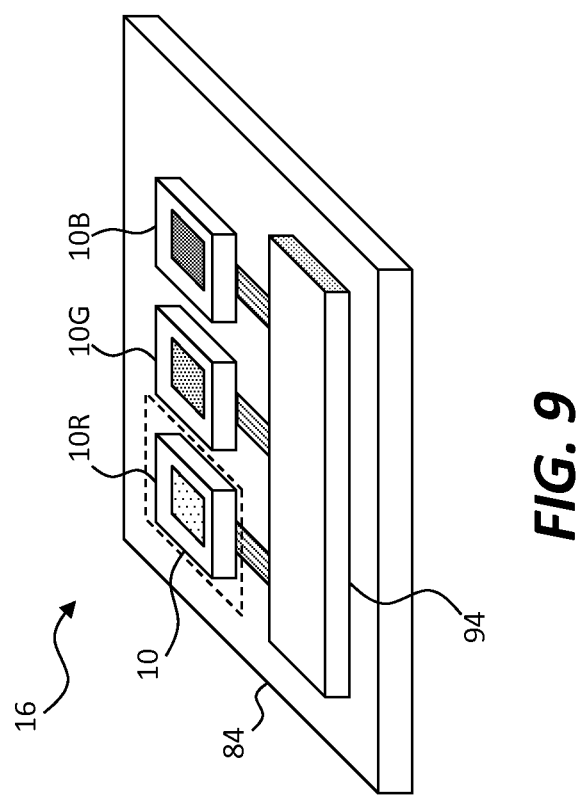
FIG. 9 is a perspective of a pixel having a separate substrate according to an embodiment of the present invention.

In an embodiment of the present invention and as shown in FIG. 9, the pixel controllers 94 and the OLED structures 10 in a pixel 90 are disposed on a pixel substrate 84 that is separate and distinct from the display substrate 80 and forms a pixel component 16. The pixel substrate 84 can be a semiconductor substrate on or in which the pixel controller circuits are formed (not shown), or the pixel substrate 84 can also be separate and distinct from the pixel controller 94 substrate (as shown).

As shown in FIG. 10, the pixel components 16 are then disposed on the display substrate 80, for example by micro transfer printing to form a micro-transfer printed display 82 or by using pick-and-place technology. The pixel components 16 can be surface mount components.

Figure 12:
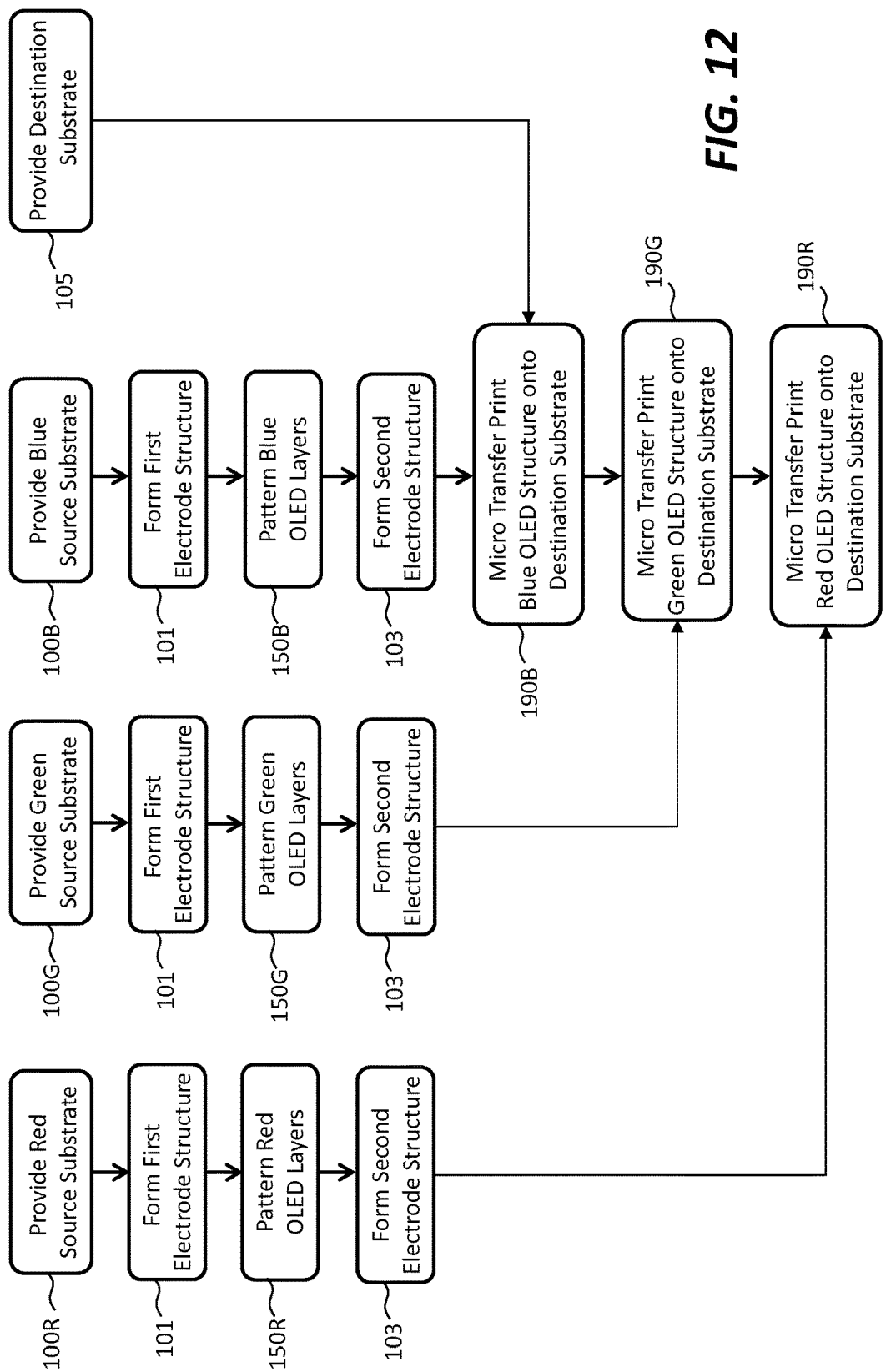

The present invention provides an advantage over structures and methods of the prior art in that OLED structures 10 of the present invention emitting different colors of light can each be made on a different source substrate 20 so that each source substrate 20 can include OLED structures 10 that emit light of only a single color. This reduces alignment and tolerance issues and avoid repeatedly contacting the source substrate 20 with shadow masks. Referring to FIG. 12, a red source substrate 20R is a source substrate 20 with an organic layer that emits red light, a green source substrate 20G is a source substrate 20 with an organic layer that emits green light, and a blue source substrate 20B is a source substrate 20 with an organic layer that emits blue light. Each of the red, green, and blue source substrates are different and separate source substrates 20 that can each supply a red, green, or blue OLED structure 10R, 10G, or 10B, respectively.

As shown in FIG. 12, a red source substrate 20R is provided in step 100R, a green source substrate 20G is provided in step 100G, a blue source substrate 20B is provided in step 100B, and a destination substrate such as a displays substrate 80 is provided in step 105. As shown in FIG. 11, the steps 110 through 140 form a first electrode structure in step 101 and the steps 160-180 form a second electrode structure in step 103. After the different source and destination substrates 20, 80 are provided in FIG. 12, the first electrodes 55 are separately and independently formed on each of the red, green, and blue source substrates 20R, 20G, and 20B in step 101. One or more layers of organic material 60 that emit red light are then patterned on the red source substrate 20R, one or more layers of organic material 60 that emit green light are then patterned on the green source substrate 20G, and one or more layers of organic material 60 that emit blue light are then patterned on the blue source substrate 20B in steps 150R, 150G, 150B, respectively. The second electrodes 52 are separately and independently formed on each of the red, green, and blue layers of organic material on each of the red, green, and blue source substrates 20R, 20G, and 20B in step 103. The blue OLED structures 10B are then micro transfer printed to the destination substrate 80, the green OLED structures 10G are micro transfer printed to the destination substrate 80, and the red OLED structures 10R are micro transfer printed to the destination substrate 80 in steps 190B, 190G, and 190R to form the display structure illustrated in FIG. 8. The steps 190B, 190G, and 190R can be performed in any order. If pixel components 16 are desired, the red, green, and blue OLED structures 10R, 10G, 10B from the red, green, and blue source substrates 20R, 20G, and 20B, respectively, are each micro transfer printed onto the pixel substrate 84 and then the pixel substrates 84 are disposed on the destination substrate 80.

The controller 92 and pixel controllers 94 can be made in one or more integrated circuits having separate, independent, and distinct substrates. For example, the pixel controllers 94 can be chiplets, small, unpackaged integrated circuits such as unpackaged dies interconnected with wires connected to contact pads on the chiplets. The chiplets can be disposed on an independent light-emitter substrate, such as a pixel substrate 84 or a display substrate 80. If the chiplets are disposed on pixel substrates 84, the pixel substrates 84 can be disposed on the display substrate 80. In an embodiment, the chiplets are made on a semiconductor wafer and have a semiconductor substrate and the display substrate 80 is or includes glass, resin, polymer, plastic, or metal. The pixel substrates 84 can be made in semiconductor materials or in glass, resin, polymer, plastic, or metal. Semiconductor materials (for example silicon) and processes for making small integrated circuits are well known in the integrated circuit arts. Likewise, display substrates 80 (destination substrates) and means for interconnecting integrated circuit elements on the display substrate 80 are well known in the printed circuit board arts. The chiplets can be applied to the pixel substrates 84 or to the display substrate 80 using micro transfer printing. The pixel substrates 84 can be applied to the display substrate 80 using micro transfer printing.

In one method of the present invention the pixel substrates 84 are disposed on the display substrate 80 by micro transfer printing using compound micro assembly structures and methods, for example as described in U.S. patent application Ser. No. 14/822,868, filed Aug. 10, 2015, entitled *Compound Micro-Assembly Strategies and Devices*, which is hereby incorporated by reference in its entirety. However, since the pixel substrates 84 are larger than the chiplets, in another method of the present invention, the pixel substrates 84 are disposed on the display substrate 80 using pick-and-place methods found in the printed-circuit board industry, for example using vacuum grippers. The OLED structures 10 or pixel controllers 94 on the pixel substrates 84 can be interconnected using photolithographic methods and materials or on the display substrate 80 using printed circuit board methods and materials.

In useful embodiments the display substrate 80 includes material, for example glass or plastic, different from a material in an integrated-circuit or chiplet substrate, for example a semiconductor material such as silicon. The pixel controllers 94 can be formed separately on separate semiconductor substrates, assembled onto the pixel substrates 84, and then the assembled unit is disposed on the surface of the display substrate 80. This arrangement has the advantage that the OLED structure 10 can be separately tested on the pixel substrates 84 and the pixel substrate 84 accepted, repaired, or discarded before it is located on the display substrate 80, thus improving yields and reducing costs.

The OLED structures 10 are electrically connected to one or more electrically conductive wires 98, 99 that electrically connect the OLED structures 10 and the pixel controllers 94 or controllers 92 to conduct power, a ground reference voltage, or signals for controlling the OLED structures 10. In an embodiment, the wires 96 are connected to a controller 92 that is external to the display substrate 80. In an alternative embodiment, not shown, the controller 92 is located on the display substrate 80 outside a display area including the OLED structures 10. If individual pixel controllers 94 are used, they can be spatially distributed over the display substrate 80 in spatial correspondence to the pixels 90 or on pixel substrates 84 that are spatially distributed over the display substrate 80. The controller 92 controls the OLED structures 10 or pixel controllers 92 by, for example, providing power, a ground reference signal, and control signals.

In an embodiment, the OLED structures 10 are transfer printed to the pixel substrates 84 or to the display substrate 80 in one or more transfers. For a discussion of micro-transfer printing techniques see, U.S. Pat. Nos. 8,722,458, 7,622,367 and 8,506,867, each of which is hereby incorporated by reference. The transferred OLED structures 10 are then interconnected, for example with conductive wires and optionally including connection pads and other electrical connection structures, to enable the controller 92 or pixel controllers 94 to electrically interact with the OLED structures 10 to emit light. In an alternative process, the transfer of the OLED structures 10 is performed before or after all of the first and second electrical conductors 98, 99 are in place. Thus, in embodiments the construction of the first and second electrical conductors 98, 99 can be performed before the OLED structures 10 are printed, or after the OLED structures 10 are printed, or both. In an embodiment, the controller 92 is externally located (for example on a separate printed circuit board substrate) and electrically connected to the conductive wires using connectors, ribbon cables, or the like. Alternatively, the controller 92 is affixed to the display substrate 80 outside the area on the display substrate 80 in which the OLED structures 10 are located and electrically connected to the first and second electrical conductors 98, 99 using wires and buses 96, for example using surface mount and soldering technology.

According to various embodiments of the present invention, the micro-transfer-printed OLED display 82 can include a display substrate 80 on which the OLED structures 10 are disposed. The display substrate 80 usefully has two opposing smooth sides suitable for material deposition, photolithographic processing, or micro-transfer printing of OLED structures 10. The display substrate 80 can have the size of a conventional display, for example a rectangle with a diagonal of a few centimeters to one or more meters. Such substrates are commercially available. The display substrate 80 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, the OLED structures 10 emit light through the display substrate 80. In other embodiments, the OLED structures 10 emit light in a direction opposite the display substrate 80. The display substrate 80 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, the display substrate 80 can include layers formed on an underlying structure or substrate, for example a rigid or flexible glass or plastic substrate. In an embodiment of the present invention, the OLED structures 10 have light-emissive areas of less than 1600 square microns, less than or equal to 800 square microns, less than or equal to 400 square microns, less than or equal to 200 square microns, less than or equal to 100 square microns, or less than or equal to 50 square microns. In other embodiments, the OLED structures 10 have physical dimensions that are less than 100 µm, for example having a width from 5 to 10 µm, 10 to 20 µm, or 20 to 50 µm, having a length from 5 to 10 µm, 10 to 20 µm, or 20 to 50 µm, or having a height from 2 to 5 µm, 4 to 10 µm, 10 to 20 µm, or 20 to 50 µm. The OLED structures 10 can provide highly saturated display colors and a substantially Lambertian emission providing a wide viewing angle.

According to various embodiments, the micro-transfer-printed OLED display 82 of the present invention, includes a variety of designs having a variety of resolutions, OLED structure 10 sizes, and displays having a range of display areas. For example, display areas ranging from 1 cm by 1 cm to 10 m by 10 m in size are contemplated. The resolution of OLED structures 10 over a display area can also vary, for example from OLED structures 10 per inch to hundreds of light emitters per inch. Thus, the present invention has application in both low-resolution and very high-resolution displays and from very small to very large displays.

As shown in FIGS. 1, 3, and 6, the full-color pixels 90 form a regular array on the display substrate 80. Alternatively, at least some of the full-color pixels 90 have an irregular arrangement on the display substrate 80.

In an embodiment, the integrated circuits or chiplets are formed in substrates or on supports separate from the display substrate 80. For example, the OLED structures 10 are separately formed in a semiconductor source wafer. The OLED structures 10 are then removed from the source wafer and transferred, for example using micro transfer printing, to the display substrate 80 or pixel substrate 84.

By employing a multi-step transfer or assembly process, increased yields are achieved and thus reduced costs for the micro-transfer-printed OLED display 82 of the present invention. Additional details useful in understanding and performing aspects of the present invention are described in U.S. patent application Ser. No. 14/743,981, filed Jun. 18, 2015, entitled *Micro-Assembled Micro LED Displays and Lighting Elements*, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer is considered "on" a substrate when a layer of sacrificial material is on top of the substrate, when a portion of the substrate itself is the sacrificial layer, or when the sacrificial layer comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 organic light-emitting diode structure
10R red organic light-emitting diode structure
10G green organic light-emitting diode structure
10B blue organic light-emitting diode structure
12 tether
14 anchor
16 pixel component
18 sacrificial layer
20 source substrate
20R red source substrate
20G green source substrate
20B blue source substrate
30 transparent insulator
32 insulator
34 bank insulator
40 transparent electrode
50 first electrode portion
52 second electrode
53 first protrusion
54 second protrusion
55 first electrode 56 second layer of second electrode
60 organic material layer(s)
65 organic light-emitting diode
70 patterned protective layer
71 barrier material
72 third conductive layer
80 destination substrate/display substrate
82 micro-transfer-printed OLED display
84 pixel substrate
90 pixel
92 controller
94 pixel controller
96 wires/bus
98 first electrical conductor
99 second electrical conductor
100 provide source substrate step
100R provide red source substrate step
100G provide green source substrate step
100B provide blue source substrate step
101 form first electrode structure step
103 form second electrode structure step
105 provide destination substrate step
110 pattern first electrode step
120 pattern transparent dielectric step
130 pattern transparent electrode step
140 pattern bank insulator step
150 pattern OLED layers step
150R pattern red OLED layers step
150G pattern green OLED layers step
150B pattern blue OLED layers step
160 pattern second electrode step
170 pattern dielectric step
180 etch sacrificial layer step
190R micro transfer print red OLED structure step
190G micro transfer print green OLED structure step
190B micro transfer print blue OLED structure step

What is claimed:

1. A structure, comprising:
a source substrate comprising a patterned sacrificial layer;
a dielectric layer disposed over and in contact with the patterned sacrificial layer, the patterned sacrificial layer disposed between the source substrate and the dielectric layer;
an organic light-emitting diode (OLED) disposed on and in contact with the dielectric layer and exclusively over the patterned sacrificial layer, the OLED comprising a first electrode, one or more layers of organic material disposed on at least a portion of the first electrode, and a second electrode disposed on at least a portion of the one or more layers of organic material, wherein the first electrode and second electrode are both in contact with the dielectric layer;
a protective layer disposed on or over the OLED and in direct contact with the dielectric layer around a periphery of the OLED to encapsulate the OLED; and
one or more fracturable tethers disposed over the patterned sacrificial layer and extending from a periphery of the organic light-emitting diode that exclusively connect the OLED to one or more anchor portions of the source substrate.

2. The structure of claim 1, wherein the OLED has a light-emitting area that has a dimension parallel to the first electrode that is less than or equal to 40 microns, less than or equal to 20 microns, less than or equal to 10 microns, or less than or equal to 5 microns.

3. The structure of claim 1, wherein the OLED has a light-emitting area that that is less than or equal to 1600 square microns, less than or equal to 800 square microns, less than or equal to 400 square microns, less than or equal to 200 square microns, less than or equal to 100 square microns, or less than or equal to 50 square microns.

4. The structure of claim 1, wherein:
the first electrode comprises a transparent electrode in electrical contact with an opaque first electrode portion, and a transparent insulator, wherein the transparent insulator is at least partly in a common layer with the opaque first electrode portion.

5. The structure of claim 4, wherein the transparent electrode is disposed on the transparent insulator.

6. The structure of claim 1, wherein the first electrode comprises a first protrusion and the second electrode comprises a second protrusion separate from the first protrusion, the first and second protrusions extending in a direction from the second electrode to the first electrode.

7. The structure of claim 1, wherein the first electrode is a unitary electrical conductor.

8. The structure of claim 1, wherein the organic-light emitting diode has at least one of a width from 5 to 10 μm, 10 to 20 μm, or 20 to 50 μm, a length from 5 to 10 μm, 10 to 20 μm, or 20 to 50 μm, and a height from 2 to 5 μm, 4 to 10 μm, 10 to 20 μm, or 20 to 50 μm.

9. The structure of claim 1, wherein the sacrificial layer is an oxide layer or a pre-determined designated portion of the source substrate.

10. The structure of claim 1, wherein the sacrificial layer comprises a cavity between the organic light-emitting diode and the source substrate.

11. The structure of claim 1, comprising a plurality of OLED structures formed on the source substrate, wherein the one or more layers of organic material in each of the OLED structures is the same.

12. The structure of claim 1, comprising:
a first conductive protrusion extending from the structure and electrically connected to the first electrode; and
a second conductive protrusion extending from the structure and electrically connected to the second electrode.

13. The structure of claim 1, comprising an encapsulation layer comprising a barrier material disposed on at least a portion of the second electrode.

14. The structure of claim 1, wherein the protective layer comprises one or more layers, is the second electrode, or comprises at least a portion of the second electrode.

15. The structure of claim 1, wherein the protective layer comprises one or more layers, is the second electrode, or comprises at least a portion of the second electrode.

* * * * *